(12) United States Patent
Huang et al.

(10) Patent No.: US 12,362,170 B2
(45) Date of Patent: Jul. 15, 2025

(54) SEMICONDUCTOR DEVICE AND METHOD FOR FORMING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Jian-Zhi Huang, Changhua County (TW); Yun-Hsuan Hsu, Hsinchu County (TW); I-Chih Ni, New Taipei (TW); Chih-I Wu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 18/471,859

(22) Filed: Sep. 21, 2023

(65) Prior Publication Data
US 2024/0014035 A1 Jan. 11, 2024

Related U.S. Application Data

(62) Division of application No. 17/313,379, filed on May 6, 2021, now Pat. No. 12,191,143.

(60) Provisional application No. 63/142,536, filed on Jan. 28, 2021.

(51) Int. Cl.
*H01L 21/02* (2006.01)
*H01L 21/321* (2006.01)
*H10D 62/80* (2025.01)

(52) U.S. Cl.
CPC .. *H01L 21/02274* (2013.01); *H01L 21/02252* (2013.01); *H01L 21/3212* (2013.01); *H10D 62/882* (2025.01)

(58) Field of Classification Search
None
See application file for complete search history.

(56) References Cited

U.S. PATENT DOCUMENTS

| | | |
|---|---|---|
| 4,686,113 A | 8/1987 | Delfino et al. |
| 11,232,982 B2 | 1/2022 | Huang et al. |
| 2008/0122367 A1 | 5/2008 | Vinogradov et al. |

(Continued)

OTHER PUBLICATIONS

Boyd et al., "Single-Step Deposition of High-Mobility Graphene at Reduced Temperatures", Nature Communications, 2015, vol. 6, pp. 1-8.

(Continued)

*Primary Examiner* — Alexander G Ghyka
(74) *Attorney, Agent, or Firm* — Birch, Stewart, Kolasch & Birch, LLP

(57) ABSTRACT

A semiconductor structure includes a semiconductor substrate, a gate structure, a source/drain structure, a contact, a dielectric layer, and a metal line. The gate structure is on the semiconductor substrate. The source/drain structure is adjacent to the gate structure. The contact lands on the source/drain structure. The dielectric layer spas the contact and the gate structure. The metal line extends through the dielectric layer to the contact. The metal line includes a liner over the contact, a magnetic layer over the liner, a graphene layer over the magnetic layer, and a filling metal over the graphene layer. The magnetic layer has a greater permeability coefficient than the filling metal.

20 Claims, 35 Drawing Sheets

(56) References Cited

U.S. PATENT DOCUMENTS

| | | | |
|---|---|---|---|
| 2009/0294759 A1 | 12/2009 | Woo et al. | |
| 2013/0175588 A1* | 7/2013 | Kelber | H10N 52/01 |
| | | | 257/295 |
| 2014/0273368 A1* | 9/2014 | Hung | H01L 21/823814 |
| | | | 438/230 |
| 2015/0303299 A1* | 10/2015 | Chang | H01L 21/02568 |
| | | | 257/29 |
| 2017/0133468 A1* | 5/2017 | Colombo | H01L 29/786 |
| 2017/0141236 A1 | 5/2017 | Wu | |
| 2018/0301375 A1* | 10/2018 | Chou | H01L 21/76883 |
| 2019/0345609 A1 | 11/2019 | Chen et al. | |

OTHER PUBLICATIONS

Chen et al., "Large Area CVD Growth of Graphene", Synthetic Metals, 2015, vol. 210, pp. 95-108.

Jang et al., "Low-Temperature-Grown Continuous Graphene Films from Benzene by Chemical Vapor Deposition at Ambient Pressure", Scientific Reports, 2015, vol. 5, pp. 1-7.

Pan et al., "Growth of U-Shaped Graphene Domains on Copper Foil by Chemical Vapor Deposition", Materials, 2019, vol. 12, No. 1887, pp. 1-10.

Wei et al., "Low Temperature Critical Growth of High Quality Nitrogen Doped Graphene on Dielectrics by Plasma-Enhanced Chemical Vapor Deposition", ACS Nano, 2015, vol. 9, No. 1, pp. 164-171.

* cited by examiner

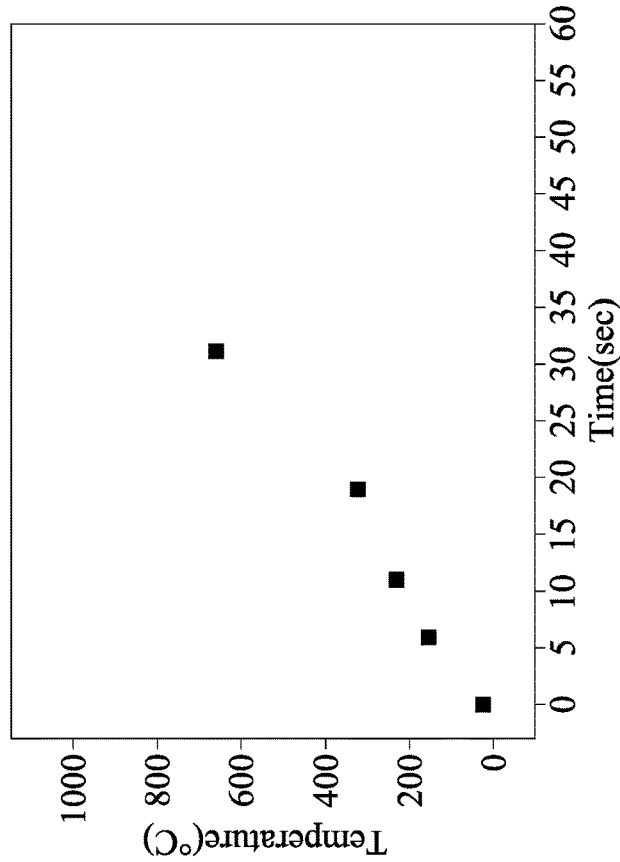
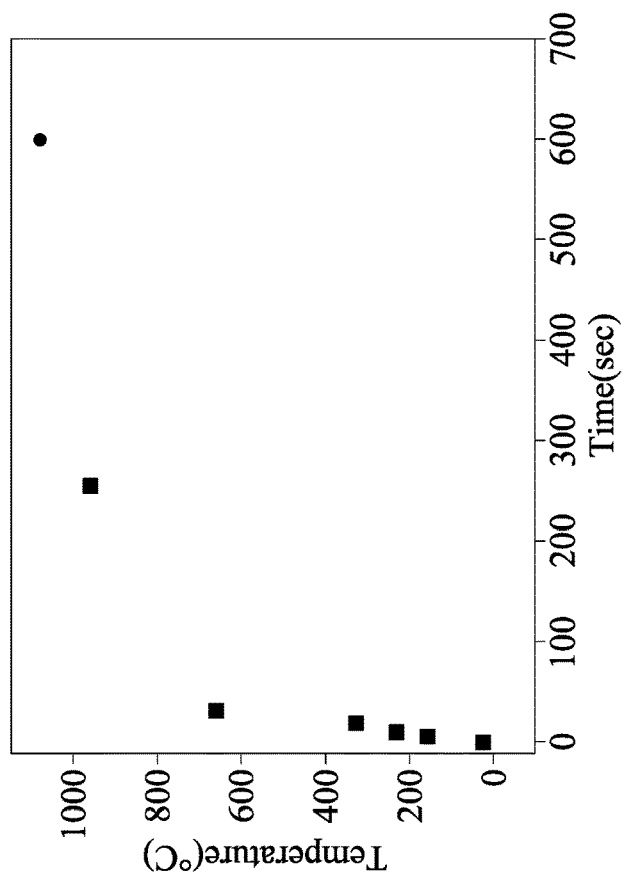
Fig. 11B
Fig. 11A

SEMICONDUCTOR DEVICE AND METHOD FOR FORMING THE SAME

PRIORITY CLAIM AND CROSS-REFERENCE

The present application is a Divisional Application of the U.S. application Ser. No. 17/313,379, filed on May 6, 2021, which claims priority to U.S. Provisional Application Ser. No. 63/142,536, filed Jan. 28, 2021, all of which are herein incorporated by reference in their entirety.

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11A illustrates experimental results showing different operation time durations of an RF (radio frequency) source effect on temperatures of a magnetic layer.

FIG. 11B illustrates a partial enlarged view of FIG. 11A.

DETAILED DESCRIPTION

Figure 1:
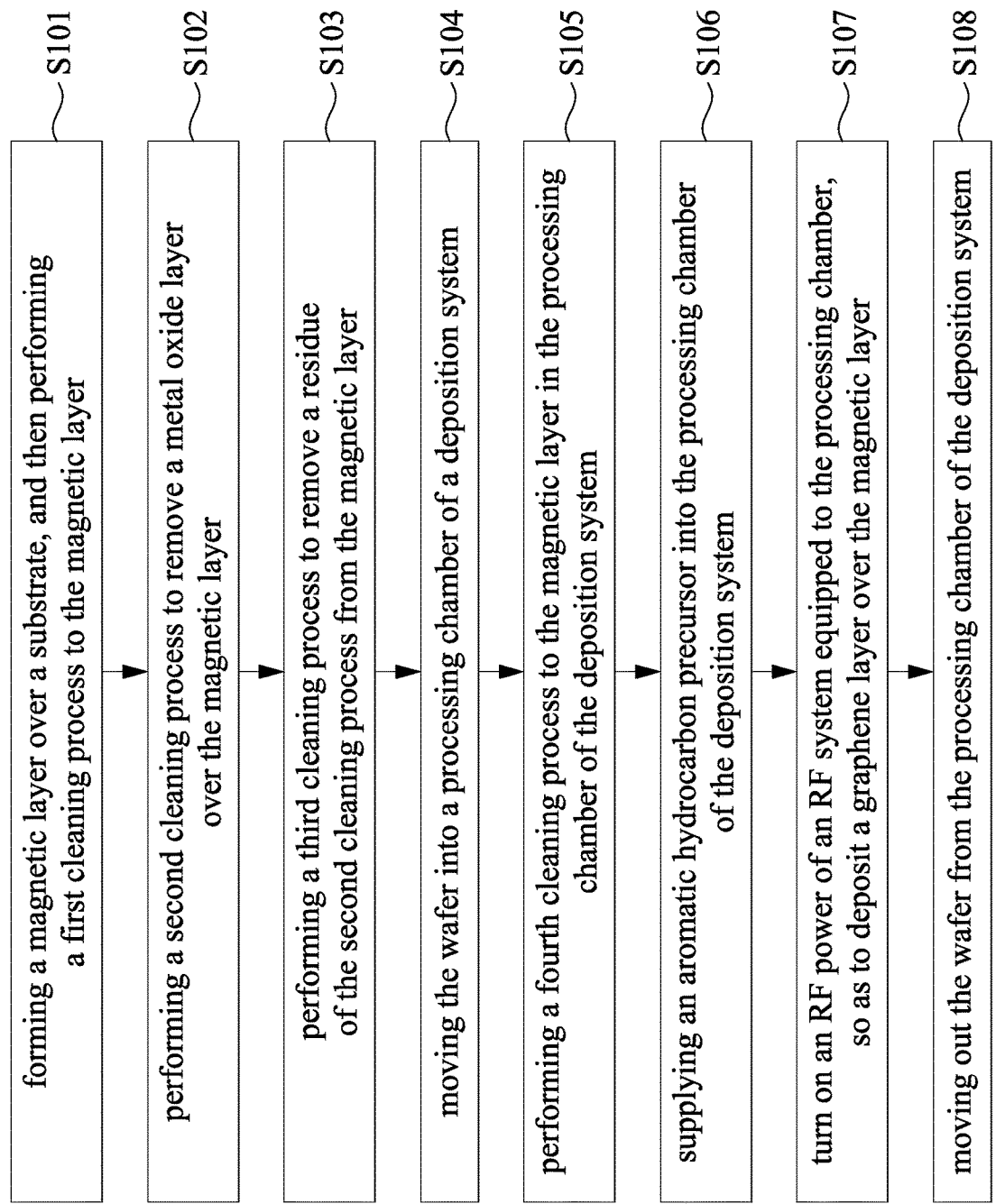
FIG. 1 is a flowchart of a method for forming a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In order to improve the conductivity of a multi-layer interconnect (MLI) of integrated circuit (IC) structure, a graphene layer may be formed on a metal line/via in the MLI by using a chemical vapor deposition (CVD) method. However, forming the graphene layer on the metal line/via by using the CVD method may require a lengthy deposition time because heating rate in the CVD method is too slow to reach a target temperature for graphene growth in a short time.

Therefore, the present disclosure in various embodiments provides a method for forming a graphene layer on a magnetic layer by using a deposition system with an RF source. An advantage is that a shortened deposition time for forming the graphene layer may be achieved to improve the production efficiency, quality, and sheet resistance of the graphene layer. In greater detail, the magnetic layer can be heated to a target temperature for graphene growth within few seconds by the RF source of the deposition system of the present disclosure, which in turn shortens the duration of depositing the graphene layer on the magnetic layer.

Referring now to FIG. 1, illustrated is a flowchart of an exemplary method M for fabrication of a semiconductor device in accordance with some embodiments. The method M includes a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable. The method M includes fabrication of a semiconductor device. However, the fabrication of the semiconductor device is merely an example for describing the manufacturing process according to some embodiments of the present disclosure.

Figure 2:
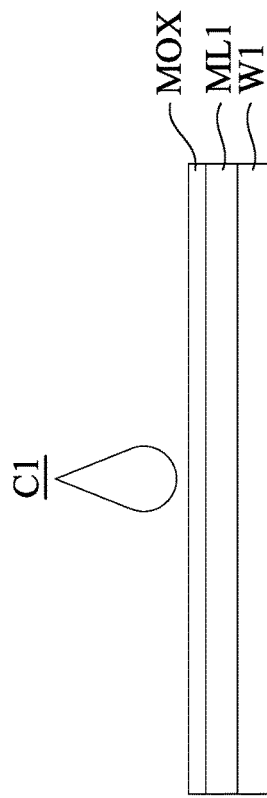
FIGS. 2 to 9 illustrate a method in various stages of forming a graphene layer in accordance with some embodiments of the present disclosure.

FIGS. 2-9 illustrate the method M in various stages of forming a graphene layer in accordance with some embodiments of the present disclosure. The method M begins at block S101. Referring to FIG. 2, in some embodiments of block S101, a magnetic layer is formed over a substrate, and then a first cleaning process is performed to the magnetic layer. A substrate W1 is shown in FIG. 2. In some embodiments, the substrate W1 may include a semiconductor substrate, such as a bulk semiconductor, a semiconductor-on-insulator (SOI) substrate, or the like. An SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate W1 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate W1 may be undoped or doped (e.g., p-type, n-type, or a combination thereof). Other materials, such as germanium, quartz, sapphire, and glass could alternatively be used for the substrate W1.

Figure 8:
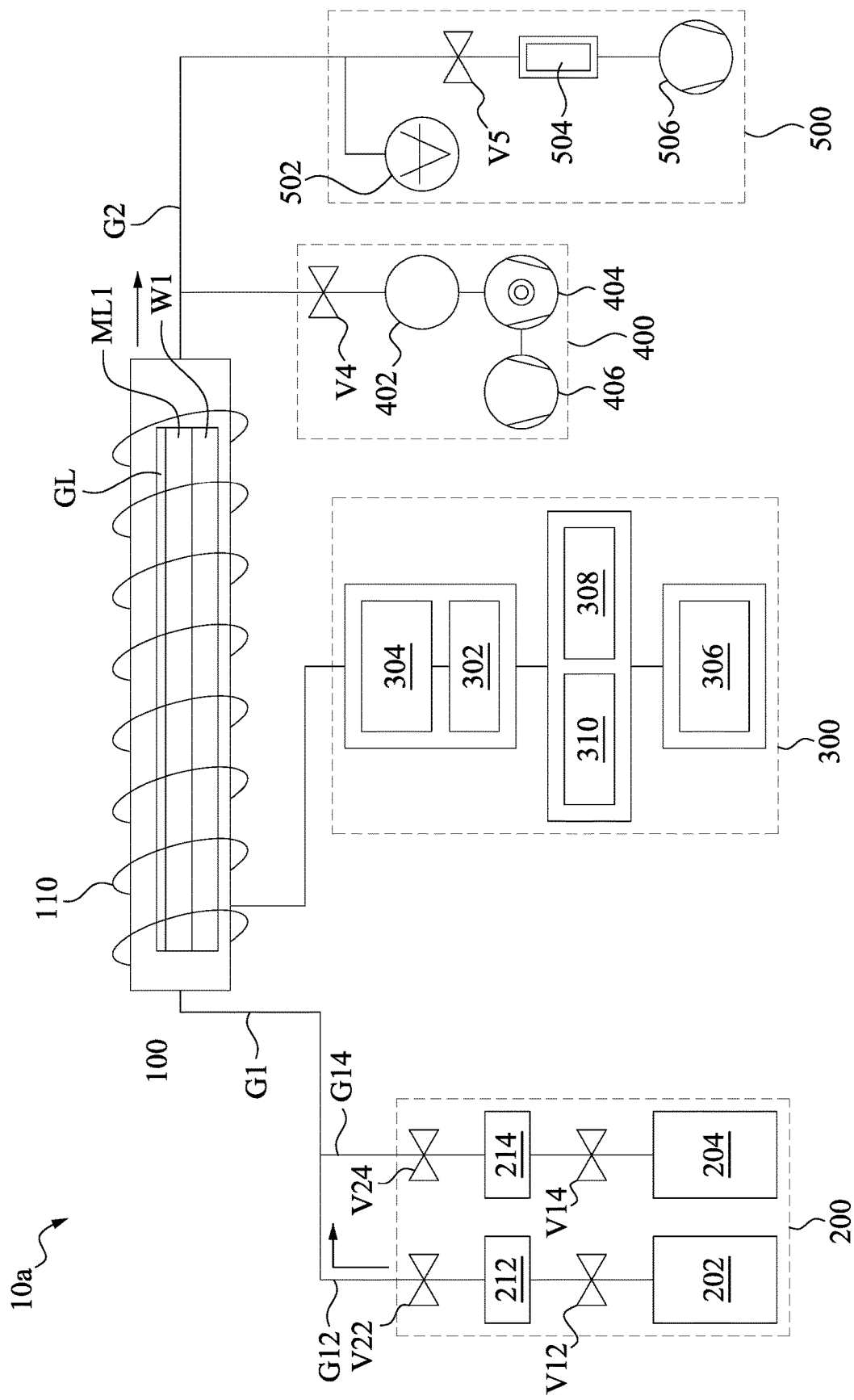

As shown in FIG. 2, a magnetic layer ML1 is deposited over the substrate W1. In some embodiments, the magnetic layer ML1 may be a magnetic foil or a magnetic film. In some embodiments, the magnetic layer ML1 may be made of a high permeability coefficient material in order to enhance the induced Eddy current thereon during the deposition process of the graphene layer as shown in FIG. 8. In other words, the magnetic layer ML1 may be made of a material that has a higher permeability coefficient than the surrounding layers. By way of example but not limiting the present disclosure, the magnetic layer ML1 may have a permeability coefficient greater than about $5 \times 10^{-5}$ (H/m).

The term "permeability" as used herein refers to the increase of magnetization that occurs when a magnetic material is subjected to an applied magnetic field. In some embodiments, the magnetic layer ML1 may be made of a high hysteresis coefficient material in order to enhance the induced Eddy current thereon during the deposition process of the graphene layer GL as shown in FIG. 8. In other words, the magnetic layer ML1 may be made of a material that has a higher hysteresis coefficient than the surrounding layers. By way of example but not limiting the present disclosure, the magnetic layer ML1 may have a hysteresis coefficient greater than about 300 (A/m). In some embodiments, the magnetic layer ML1 may be made of a low conductivity material. In other words, the magnetic layer ML1 may be made of a material that has a lower conductivity coefficient than the surrounding layers. By way of example but not limiting the present disclosure, the magnetic layer ML1 may have a conductivity coefficient lower than about $1 \times 10^7$ (S/m).

In some embodiments, the magnetic layer ML1 may be made of a magnetic material, such as iron (Fe), cobalt (Co), nickel (Ni), proper alloys, suitable materials, or combinations thereof. By way of example but not limiting the present disclosure, the magnetic material may be made of CoPt, CoPd, FePt, or FePd. In some embodiments, the magnetic material in the magnetic layer ML1 has an atomic percentage greater than or equal to about 10% (e.g., about 10%, 20%, 30%, 40%, 50%, 60%, 70%, 80%, or 90%). In some embodiments, the magnetic material is evenly dispersed in the magnetic layer ML1. That is, any position in the magnetic layer ML1 substantially has the same atomic percentage of the magnetic material. In some embodiments, the magnetic material in an upper portion of the magnetic material has a higher atomic percentage than a lower portion of the magnetic layer ML1. In some embodiments, an entirety of the magnetic layer ML1 is made of the same magnetic material.

In some embodiments, the magnetic layer ML1 may include a plurality of magnetic materials. By way of example but not limiting the present disclosure, the plurality of magnetic materials may include iron (Fe), cobalt (Co), nickel (Ni), proper alloys, or other suitable materials, such as CoFeTa, NiFe, CoFe, NiCo. By way of example but not limiting the present disclosure, the magnetic layer ML1 may include nickel with an atomic percentage in a range from about 70% to about 90% and iron with an atomic percentage in a range from about 10% to about 30%. By way of example but not limiting the present disclosure, the magnetic layer ML1 may include nickel with an atomic percentage in a range from about 30% to about 50%, zinc with an atomic percentage in a range from about 10% to about 30% and copper with an atomic percentage in a range from about 10% to about 30% plus ferric oxide (e.g., $Fe_2O_4$) with an atomic percentage in a range from about 0.5% to about 10%. By way of example but not limiting the present disclosure, the magnetic layer ML1 may include yttrium with an atomic percentage in a range from about 70% to about 90% and bismuth with an atomic percentage in a range from about 10% to about 30% plus ferric oxide (e.g., $Fe_5O_{12}$) with an atomic percentage in a range from about 0.5% to about 10%. By way of example but not limiting the present disclosure, the magnetic layer ML1 may include cobalt with an atomic percentage in a range from about 85% to about 95%, zirconium with an atomic percentage in a range from about 2.5% to about 7.5% and tantalum with an atomic percentage in a range from about 2.5% to about 7.5%.

In some embodiments, the magnetic layer ML1 may be made of nitride or silicide of a magnetic material, such as nitride or silicide of iron (Fe), cobalt (Co), nickel (Ni), proper alloys thereof, suitable materials, or combinations thereof. In some embodiments, the magnetic layer ML1 may be made of a ferromagnetic material. By way of example but not limiting the present disclosure, the magnetic layer ML1 may include an alloy of a rare earth metal and a transition metal (RE-TM alloy), such as terbium iron cobalt (TbFeCo), terbium cobalt (TbCo), RE-cobalt palladium (RE-CoPd), RE-cobalt platinum (RE-CoPt), suitable materials, or combinations thereof. In some embodiments, the magnetic layer ML1 may be made of a magnetic material with a dopant, such as boron (B), therein. By way of example but not limiting the present disclosure, the magnetic layer ML1 may be made of CoFeB.

In some embodiments, the magnetic layer ML1 can be deposited on the substrate W1 using suitable processes, such as PVD, CVD, ALD, sputtering, electroplating, or the like. In some embodiments, the magnetic layer ML1 has a thickness in a range from about 10 nm to about 100 nm. In some embodiments, because the magnetic layer ML1 is exposed to the air, a metal oxide layer MOX may therefore be formed over the magnetic layer ML1 due to oxidation. The metal oxide layer MOX is an oxide of the magnetic layer ML1. For example, if the magnetic layer ML1 is made of cobalt (Co), the metal oxide layer MOX may be Cobalt oxide (CoO).

As shown in FIG. 2, a first cleaning process C1 is performed to clean the surface of the substrate W1. In greater detail, the first cleaning process C1 is used to remove some contaminants on the metal oxide layer MOX. In some embodiments, the cleaning solvent of the first cleaning process C1 is an organic solvent. The organic solvent may have a polar function, such as —OH, —COOH, —CO—, —O—, —COOR, —CN—, —SO—, as non-limiting examples. In various embodiments, the organic solvent may include PGME, PGEE, GBL, CHN, EL, Methanol, Ethanol, Propanol, n-Butanol, Acetone, DMF, Acetonitrile, IPA, THF, Acetic acid, or combinations thereof.

Figure 3:
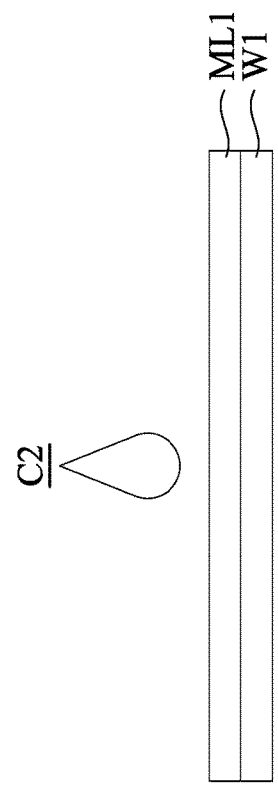

Referring back to FIG. 1, the method M then proceeds to block S102 where a second cleaning process is performed to remove a metal oxide layer on the magnetic layer. With reference to FIG. 3, in some embodiments of block S102, a second cleaning process C2 is performed to remove the metal oxide layer MOX from the magnetic layer ML1. After the second cleaning process C2, a top surface of the magnetic layer ML1 is exposed. In some embodiments, the cleaning solvent of the second cleaning process C2 may be a mineral acid (e.g., inorganic acid), such as hydrofluoric acid (HF), hydrochloric acid (HCl), nitric acid ($HNO_3$), sulfuric acid ($H_2SO_4$), or the like. In some embodiments where a magnetic layer ML1 is cleaned by a 5% nitride acid, the duration of the second cleaning process C2 is in a range from about 2 seconds to about 4 seconds (e.g., about 3 seconds in some embodiments). If the duration of the second cleaning process C2 is too short, the metal oxide layer MOX may not be sufficiently removed. While if the duration of the second cleaning process C2 is too long, the cleaning solvent of the second cleaning process C2 may cause unwanted etch to the magnetic layer ML1.

Figure 4:
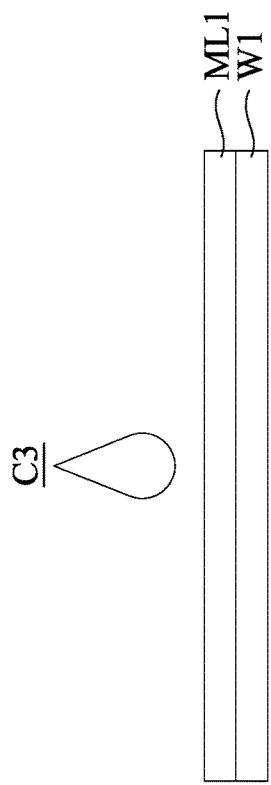

With continued reference to FIG. 1, the method M then proceeds to block S103 where a third cleaning process is performed to remove a residue of the second cleaning process from the magnetic layer. With reference to FIG. 4, in some embodiments of block S103, a third cleaning process C3 is performed to remove a residue of the cleaning solvent of the second cleaning process C2. In some embodiments, the third cleaning process C3 may use deionized water (DI water) to remove the cleaning solvent (e.g., mineral acid) of the second cleaning process C2.

Figure 10A:
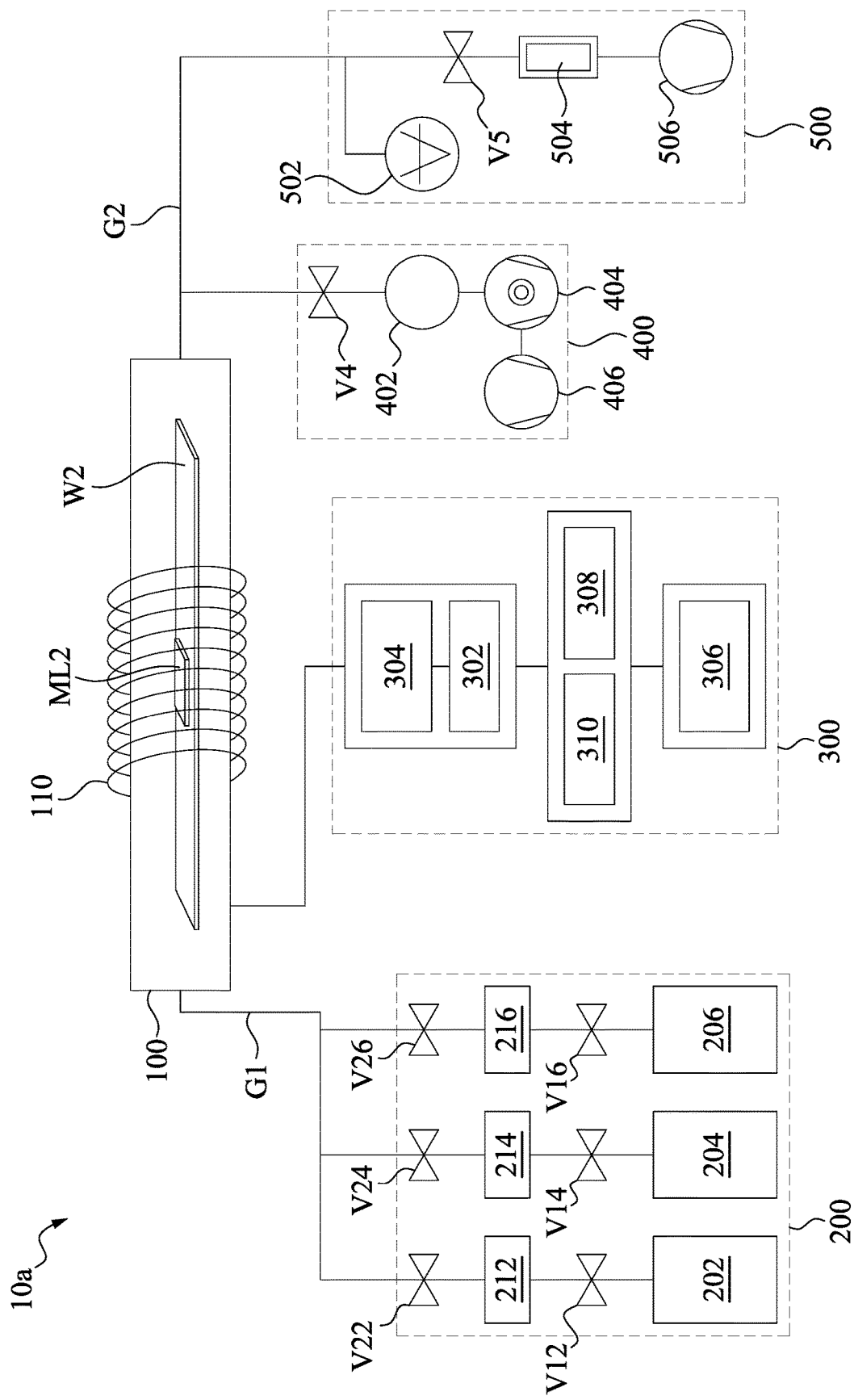
FIG. 10A is a schematic diagram of a deposition system in accordance with some embodiments of the present disclosure.
Figure 10B:
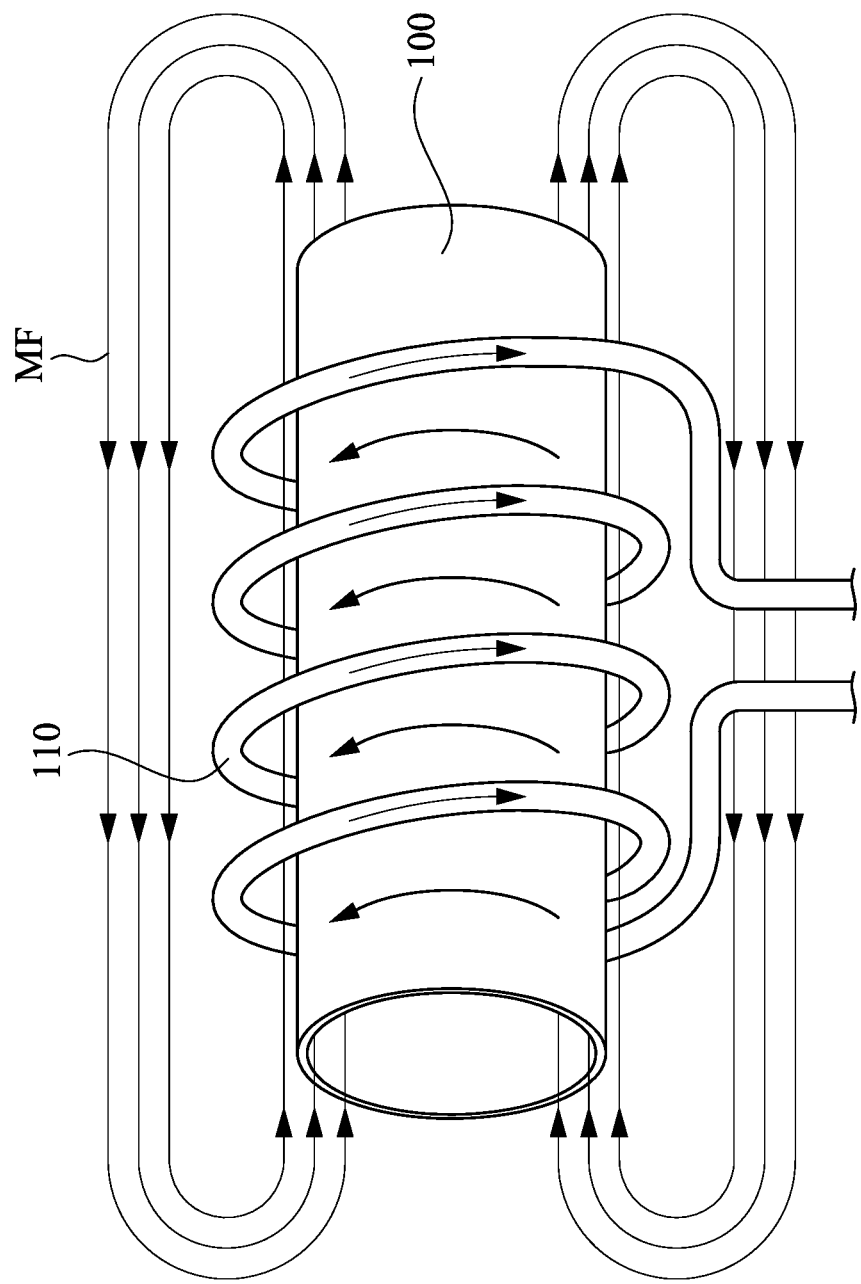
FIG. 10B illustrates a mechanism related to functioning of the deposition system in accordance with some embodiments of the present disclosure.

Referring back to FIG. 1, the method M then proceeds to block S104 where the substrate is moved into a processing chamber of a deposition system. This is described in greater detail with reference to FIGS. 10A and 10B, which illustrate a schematic diagram of an exemplary deposition system 10a in some embodiments of the present disclosure. As shown in FIGS. 10A and 10B, the deposition system 10a includes a processing chamber 100, a gas delivery system 200, an RF system 300, a residue gas analysis system 400, and a pumping system 500. In some embodiments, the gas delivery system 200 is connected to the processing chamber 100 via a gas delivery line G1, and the residue gas analysis system 400 and the pumping system 500 are connected to the processing chamber 100 via a gas delivery line G2. The RF system 300 is coupled to the processing chamber 100 by a coil 110 wound around the exterior of the processing chamber 100.

In some embodiments of FIGS. 10A and 10B, the processing chamber 100 is an elongated tube extending laterally. By way of example but not limiting the present disclosure, the processing chamber 100 may be a quartz tube. In some embodiments, the gas delivery lines G1 and G2 are fluidly communicated with the processing chamber 100, in which the gas delivery lines G1 and G2 are fluidly communicated with opposite sides of the processing chamber 100. The coil 110 is wound around the processing chamber 100 from a top to a bottom of the processing chamber 100. The processing chamber 100 can accommodate a wafer W2. For example, the wafer W2 may include a semiconductor substrate, such as a bulk semiconductor, a semiconductor-on-insulator (SOI) substrate, or the like. An SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the wafer W2 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the substrate W2 may be undoped or doped (e.g., p-type, n-type, or a combination thereof). Other materials, such as germanium, quartz, sapphire, and glass could alternatively be used for the substrate W2. A magnetic layer ML2 can be deposited on the wafer W2. In some embodiments, the magnetic layer ML2 can act as a catalytic layer for growing a graphene layer, which will be discussed below. In some embodiments, the magnetic layer ML2 as shown in FIG. 10A may be substantially the same as or comparable to that of the magnetic layer ML1 as shown in FIG. 2. Reference may be made to the detailed description provided in the foregoing paragraphs, and a description thereof will not be repeated. The magnetic layer ML2 can be deposited on the substrate W2 using suitable processes, such as PVD, CVD, ALD, sputtering, electroplating, or the like.

In some embodiments, the inductive coil 110 is connected to the RF system 300 through a transmission line such as a wave guide or a co-axial cable. The coil 110 may be made of copper (Cu), or other suitable conductive materials. In some embodiments, the coil 110 has a multiple turn cylindrical configuration and may have an electrical length of about one-quarter wavelength (<λ/4) at the operating frequency. For example, the coil 110 is positioned outside the processing chamber 100 for coupling the RF magnetic fields MF into the processing chamber 100. These induced RF magnetic fields MF ionize at least part of the process gases and thus form plasma in processing chamber 100.

The gas delivery system 200 will now be described. In some embodiments, the gas delivery system 200 includes several sources 202, 204, and 206. In the example shown in FIG. 10A, three sources are illustrated, while more or less sources may be applied in some other embodiments. The gas delivery system 200 includes several mass flow controllers 212, 214, 216, in which the mass flow controllers 212, 214, 216 are connected to the sources 202, 204, and 206 via valves V12, V14, V16, respectively. Moreover, the mass flow controllers 212, 214, 216 are connected to the gas delivery line G1 via valves V22, V24, V26, respectively.

In some embodiments, the source 202 is a liquid source, and thus the source 202 may include a liquid tank. For example, the liquid of the source 202 may be liquid aromatic hydrocarbon, such as benzene ($C_6H_6$) or toluene ($C_7H_8$). In some embodiments, the carbon elements of the liquid aromatic hydrocarbon (e.g., benzene or toluene) are used as a source for depositing a graphene layer discussed below.

On the other hand, the sources 204 and 206 are gas sources, and thus the sources 204 and 206 may include gas cylinders. The gases of the sources 204 and 206 may be, for example, $H_2$, Ar, $N_2$, $Cl_2$, or other suitable gases.

The RF system 300 will now be described. The RF system 300 includes an RF source 302, a matching box 304, a controller 306, an isolator 308, and a remote control module 310. In some embodiments, the RF energy is supplied to the processing chamber 100 by the inductive coil 110 which is powered by the RF source 302 and the matching box 304.

The input of the matching box 304 is coupled to the RF source 302, which provides RF power for plasma generation. The matching box 304 is used to match the impedance of the coil 110 to the impedance of the RF source 302, in order to deliver the maximum power to the plasma in the processing chamber 100. In some embodiments, the matching box 304 includes a matching network, a Phase and Magnitude Detector (PMD) and a controller that automatically tunes the matching network using the information supplied by the PMD.

The controller 306 may control the operation of the RF source 302. The controller 306 may include, for example, a computer including a central processing unit (CPU), a memory, and support circuits. The controller 306 operates under the control of a computer program stored in the memory or through other computer programs, such as programs stored in a removable memory. The computer program dictates, for example, the timing, mixture of gases, RF power levels and other parameters of a particular process.

The remote control module 310 is electrically coupled between the controller 306 and the RF source 302. In some embodiments, the remote control module 310 enables the controller 306 to operate the RF source 302 remotely.

The isolator 308 is electrically coupled to the RF source 302, the remote control module 310, and the controller 306. Generally, the isolator 308 is used to isolate the RF source 302 from the remote control module 310. The isolator 308 is used to protect high-power RF energy from the RF source 302. If the RF source 302 is connected directly to a load (such as the coil 110), and the load is not well matched with the RF source 302, some power reaching the load will be reflected back to the remote control module 310 and then the controller 306 that could destroy the controller 306. The isolator 308 between the controller 306 and the RF source 302 will absorb most of the reflected RF energy, which in turn will protect the controller 306 from being destroyed.

The residue gas analysis system 400 will now be described. The residue gas analysis system 400 includes a residue gas analyzer (RGA) 402, a main pump 404, and a backing vacuum pump 406. The RGA 402 is connected to the gas delivery line G2 via a valve V4. In some embodiments, the RGA 402 is a spectrometer that effectively measures the chemical composition of a gas present in a low-pressure environment. For example, the RGA 402 can ionize separate components of the gas to create various ions, and then detects and determines the mass-to-charge ratios. This process works better in vacuum, where quality is easier to monitor and impurities and inconsistencies are easier to detect because of the low pressure.

The main pump 404 is connected to the RGA 402, and the backing vacuum pump 406 is connected to the main pump 404. In some embodiments, the pumps 404 and 406 are connected in series so as to improve the pumping speed of the RGA 402. The backing vacuum pump 406 is used to lower pressure from one pressure state (typically atmospheric pressure) to a lower pressure state, after which the main pump 404 is used to evacuate the process chamber down to high-vacuum levels needed for processing. In some embodiments, the main pump 404 may be a turbo pump, a cryo pump, an ion pump, a diffusion pump, or the like. The backing vacuum pump 406 may be a rotary vane pump, a scroll pump, or the like. The gas exhausted from the backing vacuum pump may be discharged into a gas handling system (not shown) of a fab via a gas conduit.

The pumping system 500 will now be described. In some embodiments, the pumping system 500 includes a pressure gauge 502, a foreline trap 504, and a vacuum pump 506. The foreline trap 504 in connected to the gas delivery line G2 via a valve V5. The remainder of the gas mixture exhausted from the processing chamber 100, including reaction products or byproducts, is evacuated from the processing chamber 100 by the vacuum pump 506. In some embodiments, the foreline trap 504 may be a particle collector or a particle filter, which is positioned downstream from the exhaust gas source (e.g., processing chamber 100). In some embodiments, the foreline trap 504 is positioned as close as possible to the processing chamber 100 in order to maximize the amount of powder and other particulate matter that is collected within the processing chamber 100 and minimize the amount that is deposited within other areas of the gas delivery line G2. In some other embodiments, the foreline trap 504 may be a cooling trap, which recycles process gases by removing condensable material from the process gases when flowing through the foreline trap 504.

Figure 5:
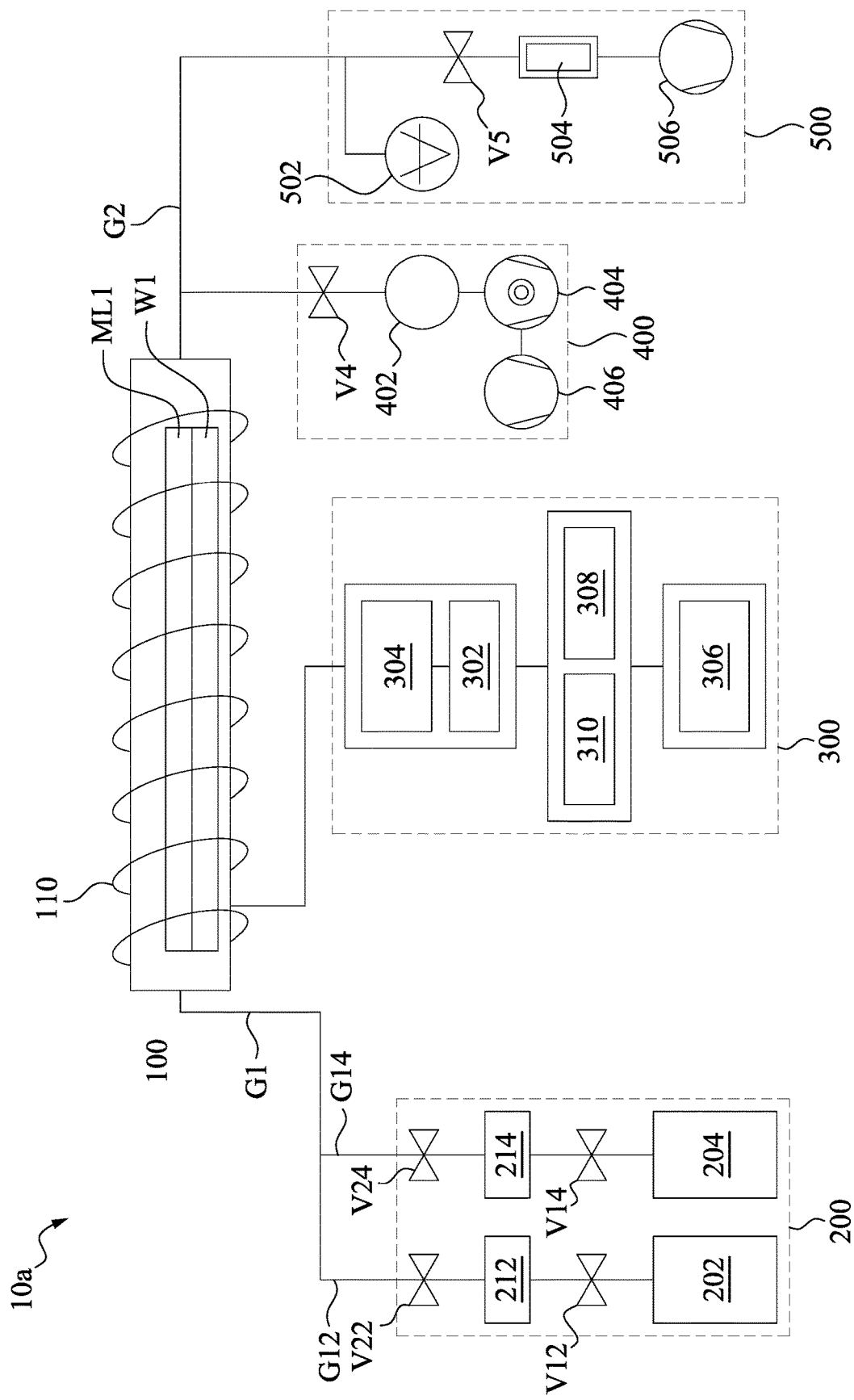

With reference to FIG. 5, in some embodiments of block S104, after the third cleaning process C3, the substrate W1 is loaded into the processing chamber 100 of the deposition system. In some embodiments, the gas delivery system 200 of the deposition system 10d in FIG. 5 only includes two sources 202 and 204. For example, the source 202 is a liquid source, and thus the source 202 may include a liquid tank. The liquid of the source 202 may, for example, be liquid aromatic hydrocarbon, such as benzene ($C_6H_6$) or toluene ($C_7H_8$). In some embodiments, the carbon elements of the liquid aromatic hydrocarbon (e.g, Benzene or Toluene) are used as a source for depositing a graphene layer discussed below. On the other hand, the source 204 is a gas source, and thus the source 204 may include gas cylinder. In some embodiments, the gas of the source 204 may be $H_2$. In some embodiments, a gas delivery line G12 connects the source 202 to the gas delivery line G1 (or the processing chamber 100), and a gas delivery line G14 connects the source 204 to the gas delivery line G1 (or the processing chamber 100).

Figure 6:
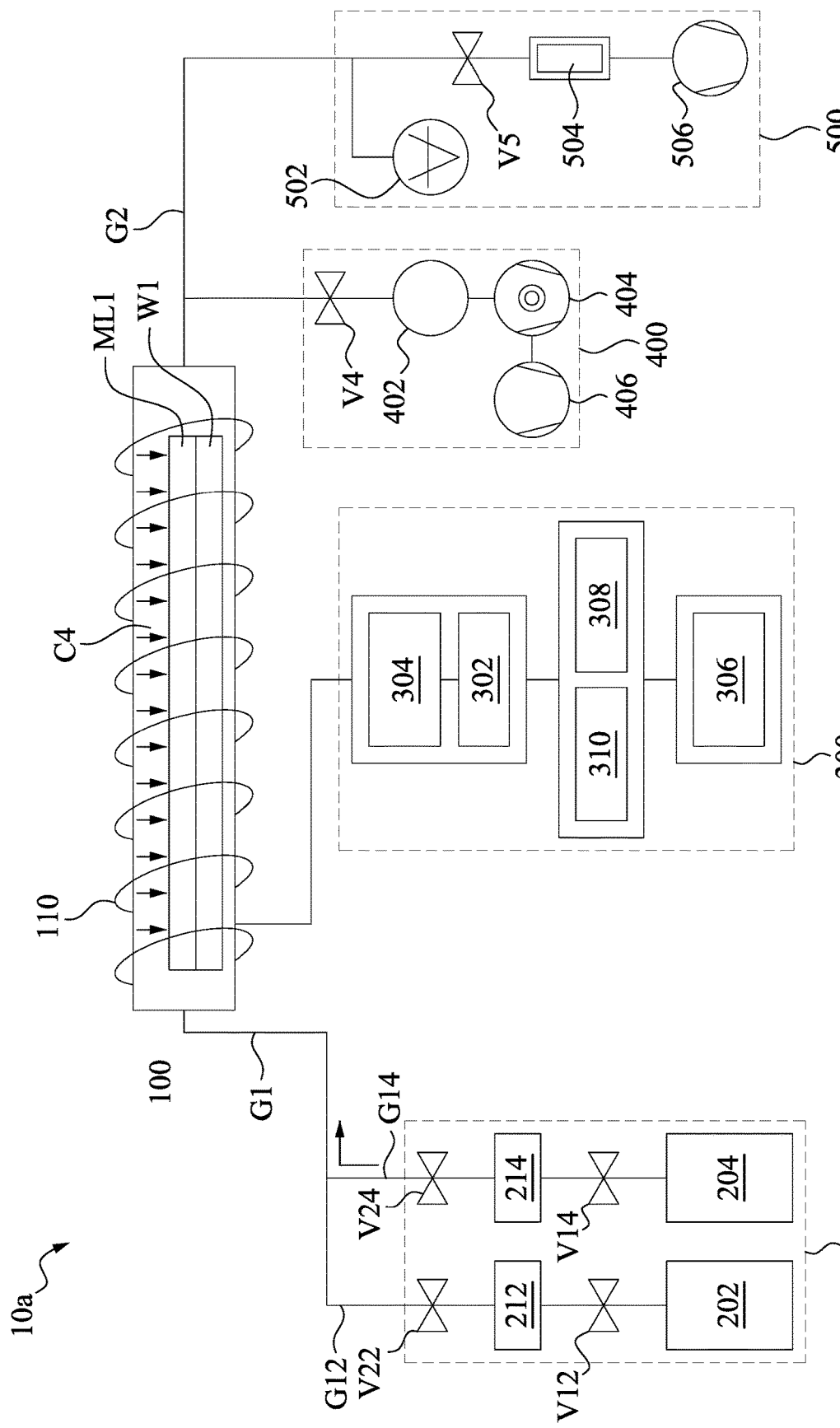

Referring back to FIG. 1, the method M then proceeds to block S105 where a fourth cleaning process is performed to the magnetic layer in the processing chamber of the deposition system. With reference to FIG. 6, in some embodiments of block S105, a fourth cleaning process C4 is performed to clean the substrate W1. The fourth cleaning process C4 is performed by, for example, turning on the valves 14 and 24 of the gas delivery system 200, such that the gas inside the source 204 can flow through the mass flow controller 214 and then flows into the gas delivery lines G14 and G1. For example, $H_2$ flows from the source 204 into the processing chamber 100 through the gas delivery lines G14 and G1. In some embodiments, the mass flow controller 214 is controlled such that the flow rate of $H_2$ is in a range from about 1 sccm to about 5 sccm.

Meanwhile, the RF source 302 of the RF system 300 is turned on with an RF power in a range from about 150 W to about 200 W, such that the $H_2$ that flows into the processing chamber 100 becomes hydrogen plasma ($H_2$ plasma). The hydrogen plasma may etch and clean the magnetic layer ML1 over the substrate W1. The plasma can remove unwanted metal oxide on the substrate W1. For example, $H^+ + CoO \rightarrow Co + H_2O$, in which a reduction-oxidation process takes place, such that the CoO becomes Co. In some embodiments, the duration of the fourth cleaning process C4 is in a range from about 20 seconds to about 40 seconds (e.g., about 30 secs in some embodiments). If the duration of the fourth cleaning process C4 is too short, the magnetic layer ML1 may not be sufficiently cleaned. While if the duration of the fourth cleaning process C4 is too long, the hydrogen plasma of the fourth cleaning process C4 may cause unwanted consumption to the magnetic layer ML1. On the other hand, the fourth cleaning process C4 can also activate the surface of the magnetic layer ML1. The hydrogen plasma removes unwanted metal oxide on the magnetic layer ML1 to make sure the surface of the magnetic layer ML1 is pure metal (e.g., Co), such that the metal can act as a catalyst in the following graphene deposition process.

It is noted that in the step of FIG. 6, the valve V22 of the gas delivery system 200 is turned off, such that only the gas (e.g., $H_2$) in the source 204 is supplied into the processing chamber 100 during cleaning of the substrate W1. That is, during the fourth cleaning process C4, the processing chamber 100 is free of aromatic hydrocarbon. On the other hand, during the fourth cleaning process C4, the pumping system 500 is turned on, so as to pump out the gas (e.g., $H_2$) in the processing chamber 100. In greater detail, the gas (e.g., $H_2$) in the processing chamber 100 is pumped out to the pumping system 500 through the gas delivery line G2. In some embodiments, during the fourth cleaning process C4 of FIG. 8, the gas environment of the processing chamber 100 is substantially a pure hydrogen ($H_2$) environment.

Referring back to FIG. 1, the method M then proceeds to block S106 where an aromatic hydrocarbon precursor is supplied into the processing chamber of the deposition system. After cleaning the magnetic layer ML1 of FIG. 6, the valve 24 of the gas delivery system 200 is turned off, such that supply of the gas (e.g., $H_2$) in the source 204 to the processing chamber 100 is stopped. Meanwhile, the RF system 300 is turned off. That is, the RF power of the RF system 300 in this step is a zero value or negligibly small. On the other hand, the pumping system 500 may pump out (remove) the remaining gas (e.g., hydrogen gas $H_2$) in the processing chamber 100, so as to create a vacuum environment in the processing chamber 100.

Figure 7:
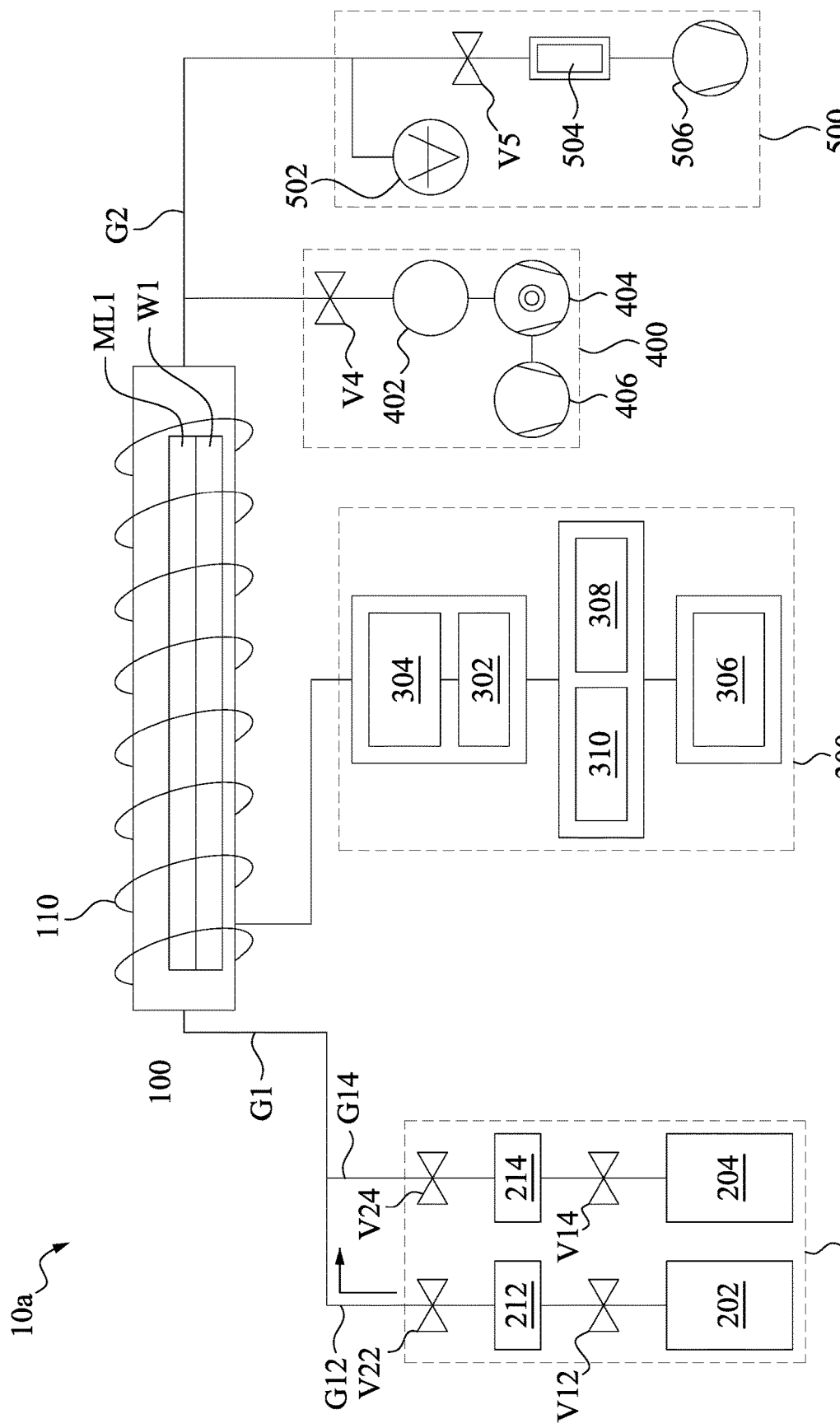

With reference to FIG. 7, in some embodiments of block S106, an aromatic hydrocarbon precursor can be provided into the processing chamber 100 and over the magnetic layer ML1. Subsequently, the valves 12 and 22 of the gas delivery system 200 are turned on. As mentioned above, the source 202 is a liquid source. The liquid source may be liquid aromatic hydrocarbon, such as benzene ($C_6H_6$) or toluene ($C_7H_8$). In some embodiments, the aromatic hydrocarbon (e.g., benzene or toluene) is used as a precursor for depositing a graphene layer discussed in FIG. 8. Although the source 202 is a liquid aromatic hydrocarbon source, the liquid aromatic hydrocarbon may volatilize easily. Accordingly, as the valve 12 is turned on, the liquid aromatic hydrocarbon in the source 202 may volatilize and transform from a liquid phase to a gas phase, and the aromatic hydrocarbon gas (e.g., Benzene gas or Toluene gas) may flow through the mass flow controller 212 and then flows into the gas delivery lines G12 and G1. For example, the aromatic hydrocarbon gas flows from the source 202 into the processing chamber 100 through the gas delivery lines G12 and G1. In some embodiments, the mass flow controller 212 is controlled such that the flow rate of the aromatic hydrocarbon gas is in a range from about 0.5 sccm to about 1 sccm. If the flow rate is too low (e.g., much lower than about 0.5 sccm), the concentration of the aromatic hydrocarbon gas may be too low to provide sufficient carbon. If the flow rate is too high (e.g., much higher than about 1 sccm), the carbon concentration may be too high and may affect the quality of the graphene layer. In some embodiments, the aromatic hydrocarbon gas is supplied into the processing chamber 100 without using a carrier gas, such as Ar or $H_2$. That is, the gas environment of the processing chamber 100 is substantially a pure aromatic hydrocarbon gas environment in this step, which will facilitate the formation of the graphene layer in FIG. 8.

In some embodiments, when a precursor for depositing a graphene layer is methane ($CH_4$), acetylene ($C_2H_2$), or ethylene ($C_2H_4$), it will take a longer time to form a graphene layer because each molecule provides less carbon atoms. However, because the precursor for depositing the graphene layer is an aromatic hydrocarbon precursor, a molecule of an aromatic hydrocarbon can provide more carbon atoms (e.g., $C_6H_6$ or $C_7H_8$) than a molecule of methane ($CH_4$), acetylene ($C_2H_2$), or ethylene ($C_2H_4$). Accordingly, a deposition rate of the graphene layer can be increased when using an aromatic hydrocarbon precursor in some embodiments of the present disclosure, which in turn allows for improving a production efficiency of the graphene layer.

It is noted that in the step of FIG. 8, the valve V24 of the gas delivery system 200 has been turned off, such that only the aromatic hydrocarbon in the source 202 is supplied into the processing chamber 100. In some embodiments, the aromatic hydrocarbon gas is used as a precursor in the deposition process in FIG. 8, and thus aromatic hydrocarbon gas can be interchangeably referred to as an aromatic hydrocarbon precursor in the following content.

With reference again to FIG. 1, the method M then proceeds to block S107 where an RF power of an RF system equipped to the processing chamber is turned on, so as to deposit a graphene layer over the magnetic layer. With reference to FIG. 8, in some embodiments of block S107, the RF source 302 of the RF system 300 is turned on, so as to generate plasma of aromatic hydrocarbon in the processing chamber 100. The aromatic hydrocarbon precursor is decomposed (or ionized) into several active radical species, which constitute the plasma over the magnetic layer ML1. For example, the active radical species of the plasma may include aromatic radicals. "Aromatic radical" used herein refers to a radical including at least one ring of resonance bonds, such as a benzene ring.

Next, the active radicals may be deposited on the surface of the magnetic layer ML1 and may diffuse on the surface of the magnetic layer ML1. In some embodiments, some radicals will be gathered together and are close to each other. This mechanism is called "surface diffusion" of the radicals. A dehydrogenation reaction and a cyclization reaction may take place, and then covalent bonding of the active radicals and/or rings form a graphene layer GL over the magnetic layer ML1. "Dehydrogenation" used herein refers to a chemical reaction that involves the removal of hydrogen from an organic molecule. "Cyclization" used herein refers to the process in which the radicals are combined and transformed into 'benzene' rings. Generally, the RF source 302 of the RF system 300 is turned on to decompose the aromatic hydrocarbon precursor into active radicals, and the active radicals are then cyclized into a graphene layer.

Referring back to FIG. 8, as mentioned above, before the RF source 302 of the RF system 300 is turned on, the processing chamber 100 is already filled with the aromatic hydrocarbon precursor (see FIG. 7). Accordingly, once the RF source 302 of the RF system 300 is turned on, the plasma of aromatic hydrocarbon can be generated immediately, and the deposition of the graphene layer GL takes place. That is, the RF system 300 is operative to trigger the graphene deposition discussed herein. For example, the aromatic hydrocarbon precursor is decomposed into several active radicals. Subsequently, a dehydrogenation reaction and a cyclization reaction take place, thereby forming the graphene layer GL on the magnetic layer ML1.

In some embodiments, a flow rate of the aromatic hydrocarbon precursor is in a range from about 0.5 sccm to about 1 sccm. In some embodiments, the processing pressure is in a range from about $1\times10^{-2}$ torr to about $2\times10^{-2}$ torr. In some embodiments, the RF power of the RF source 302 of the RF system 300 is in a range from about 250 W to about 400 W. If the RF power is too low (e.g., much lower than about 250 W), the aromatic hydrocarbon may not be sufficiently decomposed. If the RF power is too high (e.g., much higher than about 400 W), the plasma may be too strong to cause unwanted etching to the magnetic layer ML1.

As shown in FIG. 8, a high frequency induction heating process is also performed on the magnetic layer ML1, which allows for speeding up the deposition rate of the graphene layer GL. In greater detail, the magnetic layer ML1 may be heated by the RF system 300 through the coil 110 wound around thereof to speed up the deposition rate of the graphene layer GL on the magnetic layer ML1. The RF source 302 may supply high-frequency alternating current to the coil 110. The alternating current may be supplied to the coil 110 at a radio frequency, such as a frequency greater than 1000 Hz. By way of example but not limiting the present disclosure, the alternating current may be in a frequency greater than 300 kHz. The time variation in the high-frequency alternating current produces a time-varying magnetic field MF as shown in FIG. 10B at the coil 110. Therefore, the magnetic layer ML1 is positioned within the time-varying magnetic field MF generated by the coil 110.

Next, the magnetic layer ML1 may be heated to a predetermined temperature within a few seconds or less by induced eddy current generated by putting a coil 110 with high-frequency electrical current in the vicinity of the magnetic layer ML1. In other words, by controlling the RF source 302, the desired heating temperature can be achieved within a few seconds or less. By using the method and deposition systems described above, the graphene layer GL may begin to form when the temperature is greater than about 200° C. to about 400° C., and thus the graphene layer GL can be grown on the magnetic layer ML1 without using a heater other than the RF system 300, by way of example but not limiting the present disclosure. Stated another way, the deposition system 10a is free of a heater other than the RF system 300. Thus, heating the magnetic layer ML1 by using this method may be active and controllable, so as to speed up the deposition rate of the graphene layer GL on the magnetic layer ML1.

By way of example but not limiting the present disclosure, the magnetic layer ML1 may be heated to about 800° C. for less than about 30 secs in the operation of the RF source 302, which in turn allows for speeding up the deposition rate of the graphene layer GL formed thereon, so as to lower the duration of deposition time of the graphene layer GL. That is, the duration of the deposition time of the graphene layer GL may be determined by the operation duration of the RF source 302 through the coil 110, because the operation of the RF source 302 may actuate a dehydrogenation reaction and a cyclization reaction, and then covalent bond the active radicals and/or rings of the aromatic hydrocarbon to form a graphene layer GL. In some embodiments, the deposition time of the graphene layer GL is defined as the duration between turning on the RF source 302 of the RF system 300 and turning off the RF source 302 of the RF system 300. In some embodiments, the duration of deposition time of the graphene layer GL on the magnetic layer ML1 may be less than about 30 secs during the operation of the RF source 302. In some embodiments, the duration of deposition time of the graphene layer GL on the magnetic layer ML1 may be less than or equal to about 12 secs (e.g., about 3, 4, 5, 6, 7, 8, 9, 10, 11, or 12 secs) during the operation of the RF source 302. For example, in the operation of the RF source 302 to deposit the graphene layer GL, the magnetic layer ML1 may be heated to about 200° C. for about 7 secs, may be heated to about 250° C. for about 12 secs, may be heated to about 350° C. for about 18 secs, or may be heated to about 650° C. for about 32 secs. In some embodiments, a duration of deposition time of the graphene layer GL on the magnetic layer ML1 is shorter than a time duration of performing the fourth cleaning process C4. Therefore, a short deposition time of the graphene layer GL may be achieved to improve a production efficiency of the graphene layer.

In some embodiments, the magnetic layer ML1 has a better surface effect than a non-magnetic material, and therefore has a faster heating rate, which in turn allows for speeding up the deposition rate of the graphene layer GL formed thereon to ultimately result in lowering the duration of deposition time of the graphene layer GL.

In some embodiments, the magnetic layer ML1 having a greater permeability coefficient has a better surface effect than a magnetic layer having a lower permeability coefficient, and therefore has a faster heating rate. This in turn allows for speeding up the deposition rate of the graphene layer GL formed thereon to ultimately result in lowering the duration of deposition time of the graphene layer GL. In some embodiments, the magnetic layer ML1 having a greater hysteresis coefficient has a better surface effect than a magnetic layer having a lower hysteresis coefficient, and therefore has a faster heating rate. This in turn allows for speeding up the deposition rate of the graphene layer GL formed thereon to ultimately result in lowering the duration of deposition time of the graphene layer GL and improving a production efficiency of the graphene layer.

Furthermore, an ambient temperature inside the processing chamber 100 of the deposition system 10a may be determined by the RF source 302. In greater detail, the RF source 302 of the RF system 300 may generate plasma of aromatic hydrocarbon through the coil 110, which may raise the ambient temperature in the processing chamber 100. By way of example but not limiting the present disclosure, the ambient temperature inside the processing chamber 100 may be raised to about 200° C. to about 300° C. during the operation of the RF source 302. At the same time, the magnetic layer ML1 on the substrate W1 may be heated to about 800° C. for speeding up the deposition rate of the graphene layer GL formed thereon. That is, during the operation of the RF source 302, the ambient temperature inside the processing chamber 100 is lower than the temperature of the magnetic layer ML1. In some embodiments where a semiconductor device, such as a transistor, is formed on the substrate W1, the processing chamber 100 having an ambient temperature from about 200° C. to about 300° C. would not destroy the semiconductor device, thereby improving the device yield. If the ambient temperature of the processing chamber 100 is higher than about 400° C., some devices formed on the substrate W1 may be destroyed.

FIG. 11A illustrates experimental results showing different operation time durations of an RF source effect on temperatures of a magnetic layer. FIG. 11B illustrates a partial enlarged view of FIG. 11A. In FIGS. 11A and 11B, samples including a magnetic layer, such as a Co foil, on a substrate were prepared and the temperatures of the magnetic layer were measured at the predetermined time durations of operation of the RF source. For example, the magnetic layer may be heated by an RF system through a coil wound around the samples. The RF source may supply high-frequency alternating current to the coil. The alternating current may be supplied to the coil at a radio frequency, such as a frequency greater than 1000 Hz. By way of example but not limiting the present disclosure, the alternating current may be in a frequency greater than 300 kHz. In the example shown in FIGS. 11A and 11B, the RF source was operated at predetermined time durations of about 0, 7, 12, 20, 30, 250, and 600 secs.

As shown in FIGS. 11A and 11B, before the RF source of a RF system is turned on (i.e., the predetermined time is about 0 sec), the temperature of the magnetic layer is about room temperature, such as about 25° C. in some embodiments. Once the RF source of the RF system is turned on, a high frequency induction heating process is performed on the magnetic layer, which allows for heating the magnetic layer within a few seconds. In the example shown in FIGS. 11A and 11B, the magnetic layer may be heated to about 200° C. in about 7 seconds, heated to about 250° C. in about 12 seconds, and heated to about 800° C. in about 30 secs, which in turn allows for speeding up the deposition rate of a graphene layer formed thereon, so as to lower the duration of deposition time of the graphene layer. Therefore, by controlling the RF source, the desired heating temperature can be achieved within a few seconds. By using the method and deposition systems described above, the graphene layer may begin to form when the temperature is greater than about 200° C. to about 400° C., and thus the graphene layer can be grown on the magnetic layer without using a heater other than the RF system, by way of example but not limiting the present disclosure.

Raman spectroscopy is a characterization technique for a graphene layer GL. Carbon-based materials, such as graphene, may have three intense Raman features including a defect band (D band), a band related to in-plan vibration of sp2 carbon (G band), and a stacking order (2D band). For monolayer graphene, the g band has a Raman Shift located at about 1580 cm⁻, the d band has a Raman Shift located at about 1350 cm$^{-1}$, and the 2d band has a Raman Shift located at about 2700 cm$^{-1}$. The relative intensity (a.u.) of the g band frequency of Raman spectra may be used as a measure for a number of features that provide information regarding sample purity, geometry, and the metallic or semi-conducting nature of the material. Another prominent feature in the Raman spectra of carbon-based materials is the d band. The d band is sensitive to differences in the carbon network that is characteristic of many carbon-based materials, and the intensity of the d band may provide information on the electronic character of a particular material. Because a carbon lattice may contain aromatic carbons that are sp2 hybridized and may be substantially more conductive, it may be beneficial to select for the graphene layer GL having fewer numbers of non-aromatic sp3 hybridized carbon sites, or "defects" in the carbon lattice. For example, higher intensity in the d band in a Raman spectrum may indicate that a particular sample has a higher concentration of defects and may not be as conductive as a sample having a relatively lower d band intensity.

In some embodiments, a ratio of the d band to the g band (d/g ratio) may also be used as a measure of both the purity of a sample and, in relatively pure samples, can be used to characterize the defects present on the graphene layer GL, where a lower d/g ratio may indicate the a sample containing higher general concentrations of sp2 carbons, a more complete carbon lattice on the graphene layer GL, and higher general electrical and/or thermal conductivity.

In some embodiments, by using the method and deposition systems described above, the d/g ratio of the graphene layer GL formed on the magnetic layer ML1 as measured by Raman spectroscopy may be less than about 1 when the deposition time thereof is longer than about 3 secs. In some embodiments, by using the method and deposition systems described above, the d/g ratio of the graphene layer GL formed on the magnetic layer ML1 as measured by Raman spectroscopy may be less than about 0.3 when the deposition time thereof is longer than about 10 secs. In some embodiments, by using the method and deposition systems described above, the d/g ratio of the graphene layer GL formed on the magnetic layer ML1 as measured by Raman spectroscopy may be less than about 0.1 when the deposition time thereof is longer than about 12 secs. Therefore, by using the method and deposition systems described above, a short deposition time (e.g., about 3-30 secs in some embodiments, such as about 3, 5, 10, 20, or 30 seconds) of the graphene layer GL may be achieved to reduce the d/g ratio, which in turn allows for lowering the defect density (e.g., d/g ratio< about 0.5 in some embodiments, such as about 0.1, 0.2, 0.3, 0.4, or 0.5) and improving the quality and uniformity of the dgraphene layer GL.

Figure 12A:
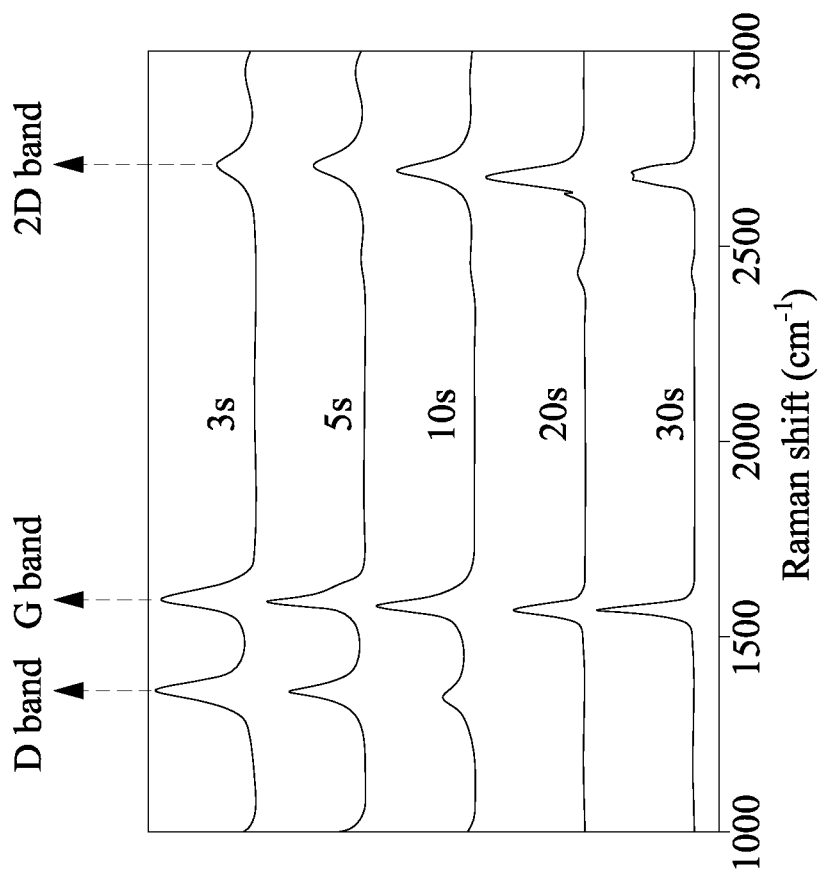
FIGS. 12A to 12C illustrate experimental results of a Raman spectrum of graphene formed over a magnetic layer with different operation time durations of the RF (radio frequency) source.
Figure 12C:
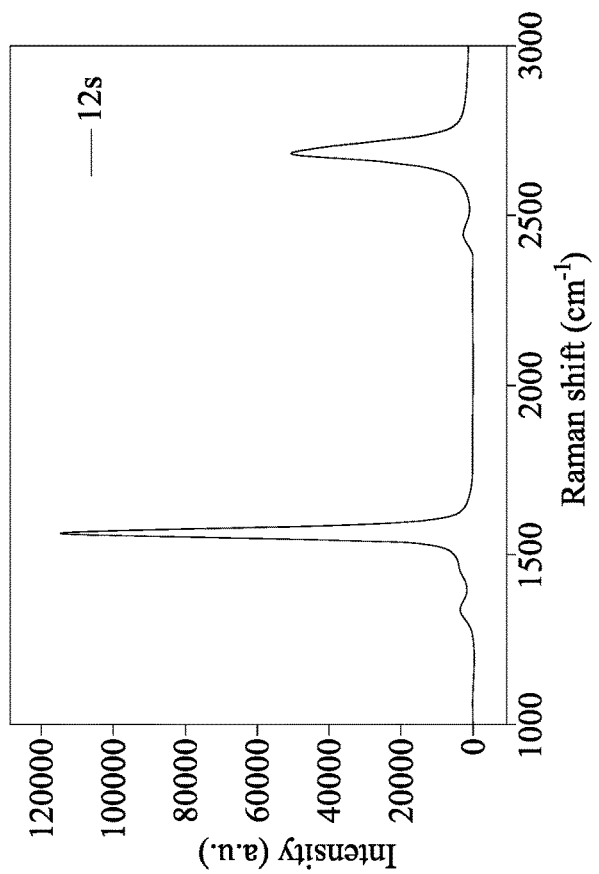
Figure 12B:
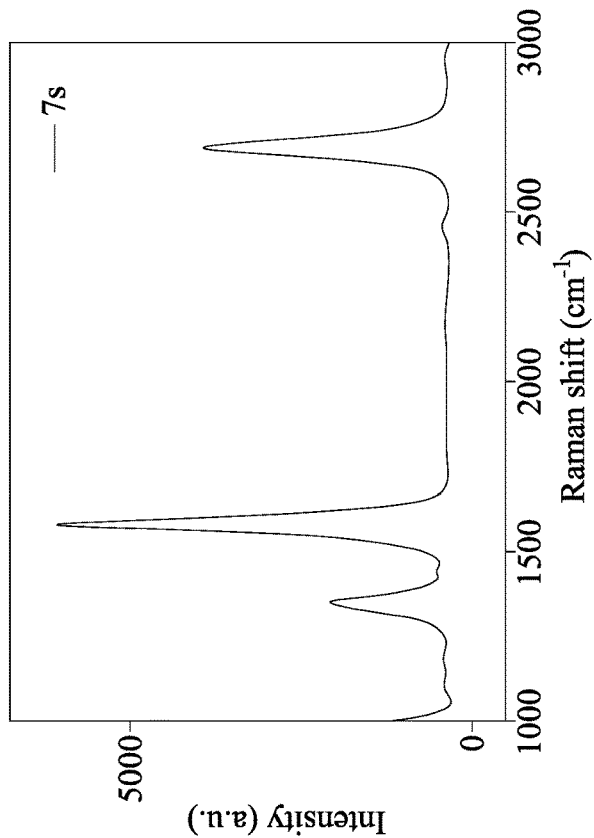
Figure 13:
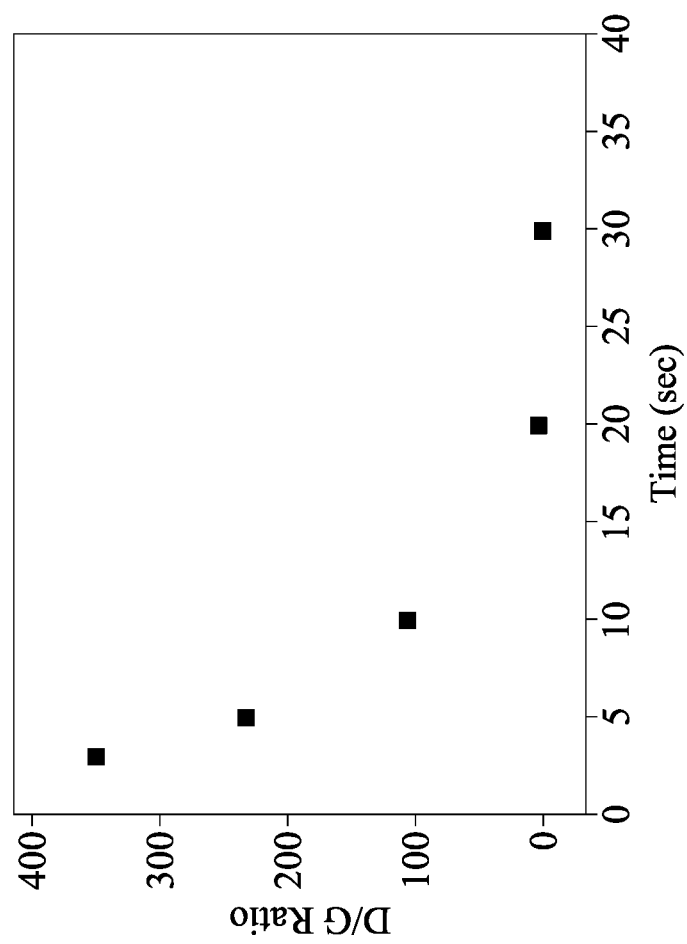
FIG. 13 illustrates experimental results showing different operation time durations of the RF (radio frequency) source effect on ratios of d band to g band (d/g ratio) of graphene formed over a magnetic layer.

FIGS. 12A to 12C illustrate experimental results of a Raman spectrum of graphene formed over a magnetic layer with different operation time durations of the RF source. In FIGS. 12A to 12C, the samples including a graphene layer formed by a precursor (e.g., benzene ($C_6H_6$)) on a magnetic layer (e.g., Co foil) were prepared and intensities of Raman shift of the graphene layer were measured after the predetermined time durations of operation of the RF source. The RF source may be supplied to the samples at a radio frequency, such as a frequency greater than 1000 Hz. By way of example but not limiting the present disclosure, the alternating current may be in a frequency greater than 300 kHz. For the samples shown in FIGS. 12A to 12C, the g band has a Raman Shift located at about 1580 cm$^{-1}$, the d band has a Raman Shift located at about 1350 cm$^{-1}$, and the 2d band has a Raman Shift located at about 2700 cm$^{-1}$. In the example shown in FIG. 12A, the RF source is operated at predetermined time durations about 3, 5, 10, 20, and 30 secs. In the example shown in FIG. 12B, the RF source is operated at the predetermined time duration about 7 secs. In the example shown in FIG. 12C, the RF source is operated at the predetermined time duration about 12 secs. FIG. 13 illustrates experimental results showing different operation time durations of the RF source effect on ratios of the d band to the g band (d/g ratio) of graphene formed over the magnetic layer of FIGS. 12A to 12C.

As shown in FIGS. 12A, 12B, 12C, and 13, the d/g ratio of the graphene layer formed on the magnetic layer as measured by Raman spectroscopy is about 1 when the time duration is about 3 secs, the d/g ratio of the graphene layer formed on the magnetic layer as measured by Raman spectroscopy is about 0.3 when the time duration is about 10 secs, and the d/g ratio of the graphene layer formed on the magnetic layer as measured by Raman spectroscopy is less than about 0.1 when the time duration is about 20 secs. Therefore, as shown in the experimental results of FIG. 13, by using the method and deposition systems described above, a short deposition time of the graphene layer may be achieved to reduce the d/g ratio, which in turn allows for lowering the defect density and improving the quality of the graphene layer.

In some embodiments, the graphene layer GL can be deposited over a large area which depends on the sizes of the RF coil 110 and the processing chamber 100. For example, in some embodiments where the area of the magnetic layer ML1 may be in a range from about 1*2 cm$^2$ to about 12*2 cm$^2$, experimental results show that the graphene layer GL has a uniform region having an area about 8*2 cm$^2$ to about 10*2 cm$^2$ (e.g., about 9*2 cm$^2$).

Figure 34:
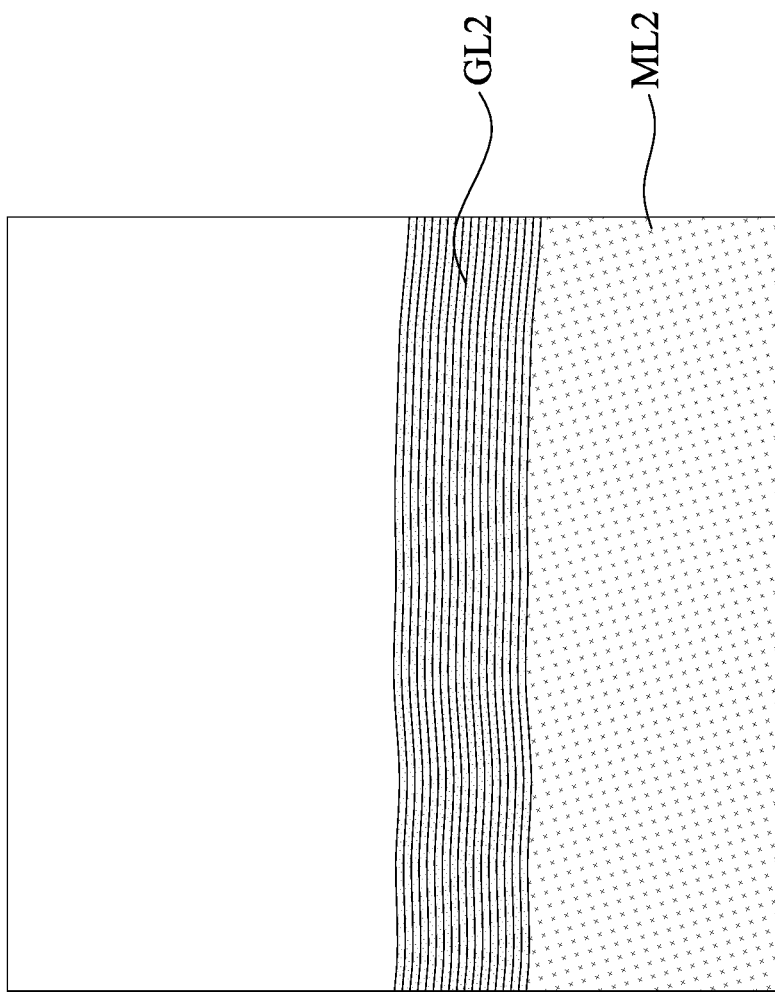
FIGS. 34 and 35 illustrate schematic transmission electron microscopy images showing different graphene growth experimental results formed in different deposition time durations.
Figure 35:
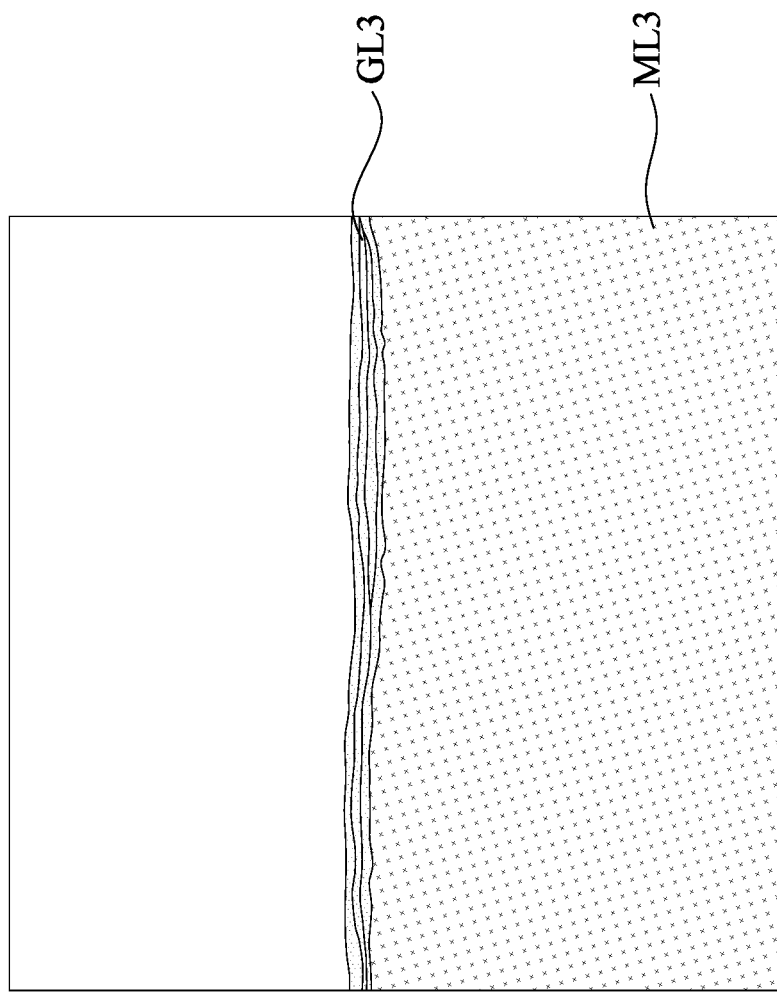

After an entirety of the magnetic layer ML1 is covered by the graphene layer GL and/or after the graphene layer GL is grown to a desired thickness, the RF source 302 of the RF system 300 can be turned off, so as to stop depositing the graphene layer GL. In some embodiments, the deposition time of the graphene layer GL formed on the magnetic layer ML1 may be less than about 30 seconds, and the graphene layer GL may have a thickness in a range from about 0.7 nm to about 7 nm, layers in a range from about 2 to about 20, and a sheet resistance lower than about 100 Ω/sq, by way of example but not limiting the present disclosure. FIGS. 34 and 35 illustrate schematic transmission electron microscopy images showing different graphene growth experimental results formed in different deposition time durations. In FIG. 34, when the deposition time of the graphene layer GL2 formed on the magnetic layer ML2 is about 12 seconds, the graphene layer GL2 may have a thickness of about 5.74 nm in about 17 layers. In FIG. 35, when the deposition time of the graphene layer GL3 formed on the magnetic layer ML3 is about 7 seconds, the graphene layer GL3 may have a thickness of about 1.8 nm in about 4 layers. In the example shown in FIG. 35, the magnetic layer may be heated to about 200° C. in about 7 seconds. In the example shown in FIG. 34, the magnetic layer may be heated to about 250° C. in about 12 seconds. Thus, by using the method and deposition systems described above, a short deposition time of the graphene layer GL formed on the magnetic layer ML1 may be achieved to improve a production efficiency, quality, and sheet resistance of the graphene layer. Moreover, as illustrated in FIGS. 34 and 35, the graphene layer GL3 formed in a shorter time duration may have a higher thickness non-uniformity than the graphene layer GL2 formed in a longer time duration, which means that the thickness uniformity of graphene may increases as deposition time increases.

Figure 14:
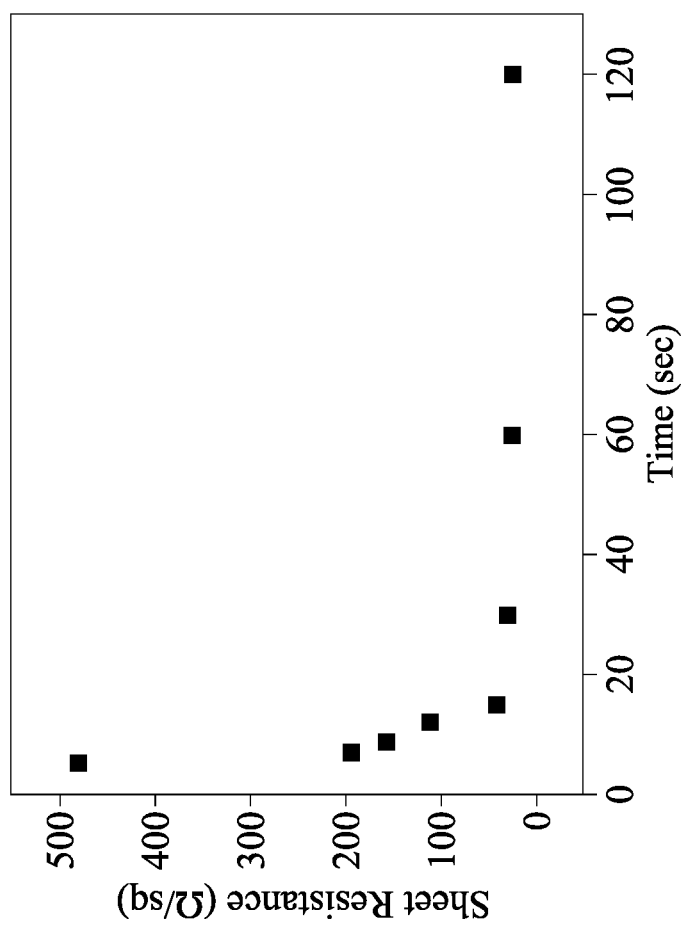
FIG. 14 illustrates experimental results showing different operation time durations of the RF (radio frequency) source effect on electrical properties.

FIG. 14 illustrates experimental results showing different operation time durations of the RF (radio frequency) source effect on electrical properties. In FIG. 14, the samples including a graphene layer formed by a precursor (e.g., benzene ($C_6H_6$)) and a magnetic layer (e.g., Co foil) were prepared, and sheet resistance (Ω/sq) was measured after the predetermined time durations of operation of the RF source. The RF source may be supplied to the samples at a radio frequency, such as a frequency greater than 1000 Hz. By way of example but not limiting the present disclosure, the alternating current may be in a frequency greater than 300 kHz. In the example shown in FIG. 14, the RF source is operated at predetermined time durations about 3, 5, 10, 12, 15, 30, 60, and 120 secs. As shown in FIG. 14, the sheet resistance (Ω/sq) of the graphene layer formed on the magnetic layer may be less than about 500 (e.g., about 480) when the time duration is about 3 secs, the sheet resistance (Ω/sq) of the graphene layer formed on the magnetic layer may be less than about 200 (e.g., about 190) when the time duration is about 5 secs, and the sheet resistance (Ω/sq) of the graphene layer formed on the magnetic layer is about 100 when the time duration is about 12 secs. Therefore, as shown in the experimental results of FIG. 14, by using the method and deposition systems described above, a short deposition time of the graphene layer may be achieved to improve a sheet resistance of the graphene layer within a few seconds.

It is noted that in the present disclosure, the aromatic hydrocarbon precursor is supplied into the processing chamber 100 without using a carrier gas, such as Ar or $H_2$. This will improve the quality of the deposited graphene layer GL, because the RF power provided by the RF system 300 may transform the carrier gas into plasma (e.g., Ar plasma or $H_2$ plasma), while the such plasma may etch the graphene layer GL during deposition.

Figure 9:
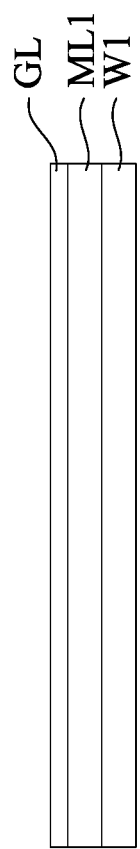

Referring back to FIG. 1, the method M then proceeds to block S108 where the substrate is moved out from the processing chamber of the deposition system. With reference to FIG. 9, in some embodiments of block S108, after the RF source 302 of the RF system 300 (see FIG. 8) is turned off, the substrate W1 is moved out from the processing chamber 100 (see FIG. 9). In some embodiments, before moving out the substrate W1 from the processing chamber 100, the valve 22 of the gas delivery system 200 may be turned off, so as to stop providing aromatic hydrocarbon precursor into the processing chamber 100.

Reference is made to FIGS. 15 to 32. FIGS. 15 to 32 illustrate a method in various stages of forming a semiconductor device in accordance with some embodiments of the present disclosure.

Figure 15:
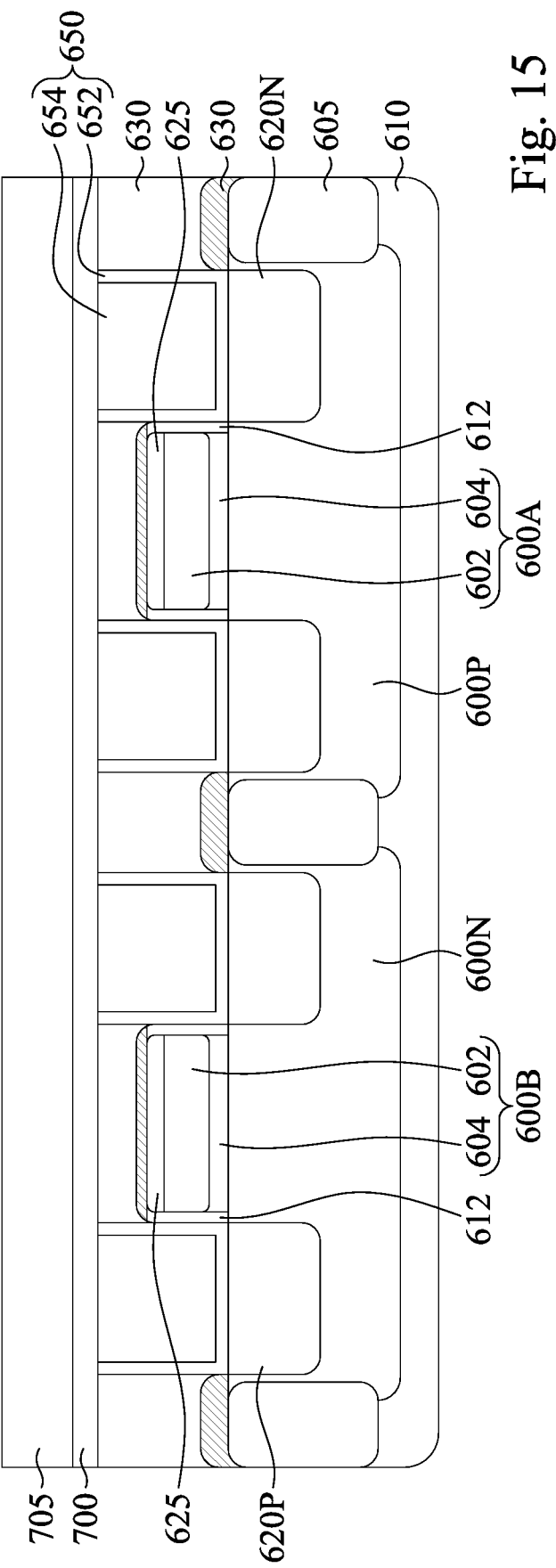
FIGS. 15 to 32 illustrate a method in various stages of forming a semiconductor device in accordance with some embodiments of the present disclosure.

Reference is made to FIG. 15. An initial structure is received. The initial structure includes a substrate 610. The substrate 610 includes an N-well region 600N and a P-well region 600P, in which the N-well region 600N may be doped with N-type impurities, and the P-well region 600P may be doped with P-type impurities. The substrate 610 may be a semiconductor material and may include known structures including a graded layer or a buried oxide, for example. Other materials, such as germanium, quartz, sapphire, and glass could alternatively be used for the substrate 610. Alternatively, the silicon substrate 610 may be an active layer of a semiconductor-on-insulator (SOI) substrate or a multi-layered structure such as a silicon-germanium layer formed on a bulk silicon layer.

Isolation structures 605 are disposed in the substrate 610. In some embodiments, the isolation structures 605 may include oxide, such as silicon dioxide. The isolation structures 605, which act as a shallow trench isolation (STI) around the P-well region 600P from the N-well region 600N, may be formed by chemical vapor deposition (CVD) techniques using tetra-ethyl-ortho-silicate (TEOS) and oxygen as a precursor.

A gate structure 600A is disposed over the P-well region 600P of the substrate 610, and a gate structure 600B is disposed over the N-well region 600N of the substrate 610. In some embodiments, each of the gate structure 600A and the gate structure 600B includes a gate dielectric 602 and a gate electrode 604. In some embodiments, the gate dielectric 602 may be, for example, silicon oxide, silicon nitride, a combination thereof, or the like, and may be deposited or thermally grown according to acceptable techniques. In some embodiments, the gate electrode 604 may include polycrystalline-silicon (poly-Si) or poly-crystalline silicon-germanium (poly-SiGe). In some other embodiments, the gate structure 600A and the gate structure 600B may be metal gate structures, which include a high-k dielectric layer, a work function metal layer over the high-k dielectric layer, and a gate metal over the work function metal layer.

Capping layers 625 are disposed over the gate structures 600A and 600B. In some embodiments, the capping layers 625 may be oxide. A plurality of gate spacers 612 are disposed on opposite sides of the gate structure 600A and the gate structure 600B. In some embodiments, the gate spacers 612 may include $SiO_2$, $Si_3N_4$, $SiO_xN_y$, SiC, SiCN films, SiOC, SiOCN films, and/or combinations thereof.

Source/drain structures 620N are disposed in the P-well region 620P of the substrate 610 and on opposite sides of the gate structure 600A, and source/drain structures 620P are disposed in the N-well region 620N of the substrate 610 and on opposite sides of the gate structure 600B. In some embodiments, the source/drain structures 620N may be doped with N-type impurities, and the source/drain structures 620P may be doped with p-type impurities. In some embodiments, the source/drain structures 620N, 620P may be may be formed by performing an epitaxial growth process that provides an epitaxy material over the substrate 610, and thus the source/drain structures 620N, 620P can be interchangeably referred to as epitaxy structures 620N, 620P in this context. In various embodiments, the source/drain structures 620N, 620P may include Ge, Si, GaAs, AlGaAs, SiGe, GaAsP, SiP, or other suitable materials.

A contact etch stop layer (CESL) 630 is disposed over the isolation structures 605 and over the capping layers 625. An interlayer dielectric (ILD) layer 640 is disposed over the CESL 630 and surrounds the gate structures 600A and 600B. In some embodiments, the CESL 630 includes silicon nitride, silicon oxynitride or other suitable materials. The CESL 630 can be formed using, for example, plasma enhanced CVD, low pressure CVD, ALD or other suitable techniques. In some embodiments, the ILD layer 640 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 640 may be formed using, for example, CVD, ALD, spin-on-glass (SOG) or other suitable techniques.

Source/drain contacts 650 are disposed in the ILD layer 640 and contact the source/drain structures 620A and 620P. In some embodiments, each source/drain contact 650 includes a liner 652 and a plug 654. The liner 652 is between the plug 654 and the underlying source/drain structures 600A or 600B. In some embodiments, the liner 652 assists with the deposition of the plug 654 and helps to reduce diffusion of a material of the plug 654 through the gate spacers 612. In some embodiments, the liner 652 includes titanium (Ti), titanium nitride (TiN), tantalum (Ta), tantalum nitride (TaN), or another suitable material. The plug 654 includes a conductive material, such tungsten (W), copper (Cu), aluminum (Al), ruthenium (Ru), cobalt (Co), molybdenum (Mo), nickel (Ni), or other suitable conductive materials.

An etch stop layer (ESL) 700 is disposed over the ILD layer 640 and the source/drain contacts 650. An inter-metal dielectric (IMD) layer 705 is disposed over the ESL 700. The material and the formation method of the ESL 700 are similar to those of the CESL 630. Moreover, the material and the formation method of the IMD layer 705 are similar to those of the ILD layer 640.

Figure 16:
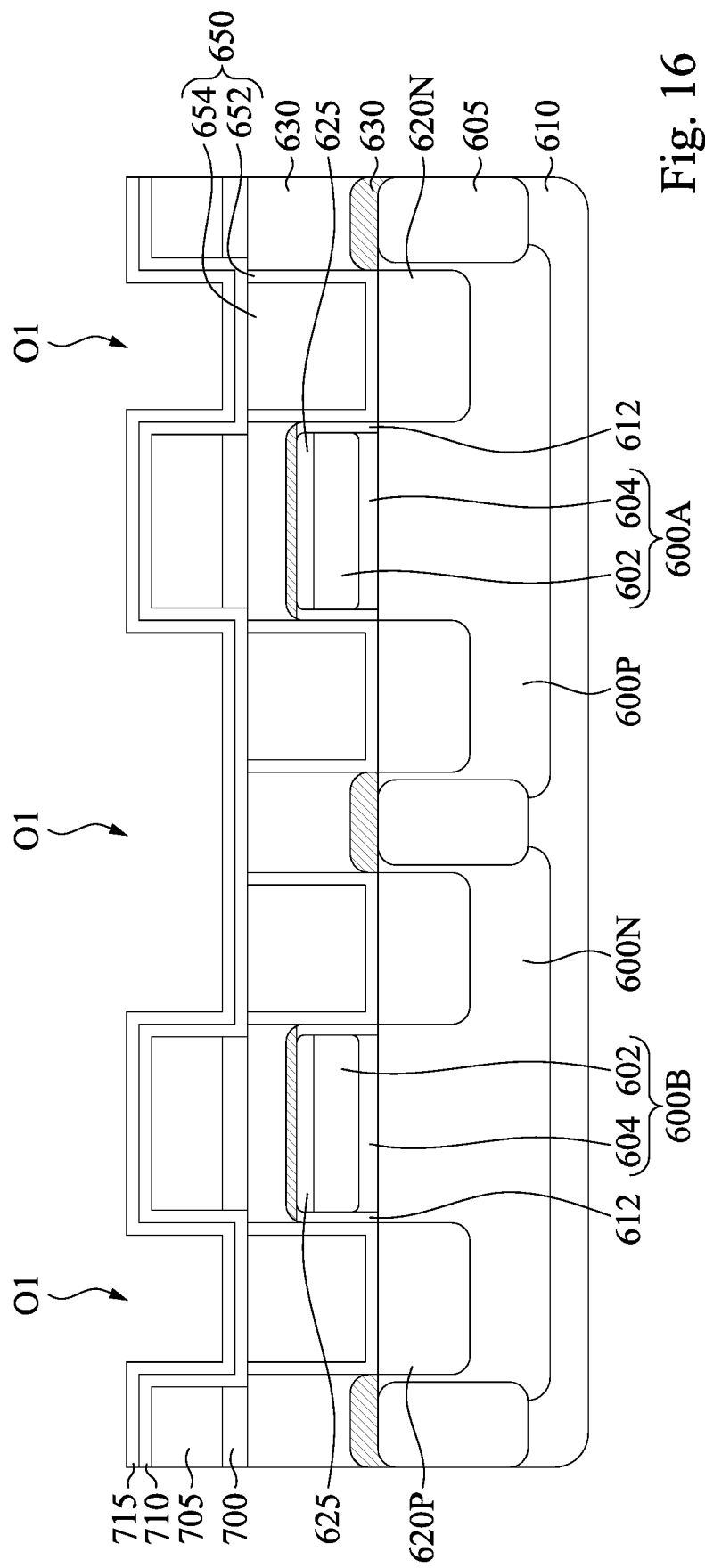

Reference is made to FIG. 16. The ESL 700 and the IMD layer 705 are patterned to form openings O1. Subsequently, a liner 710 and a magnetic layer 715 are formed in the openings O1. In some embodiments, the liner 710 includes titanium (Ti), titanium nitride (TiN), tantalum (Ta), tantalum nitride (TaN), or another suitable material. In some embodiments, the magnetic layer 715 may be made of a higher permeability coefficient material than the liner 710. The magnetic layer 715 may be made of a higher hysteresis coefficient material than the liner 710. The magnetic layer 715 may be made of a lower conductivity material than the liner 710. In some embodiments, the magnetic layer 715 may have a greater thickness than the liner 710.

In some embodiments, the magnetic layer 715 may be made of a magnetic material, such as iron (Fe), cobalt (Co), nickel (Ni), proper alloys, suitable materials, or combinations thereof. By way of example but not limiting the present disclosure, the magnetic material may be made of CoPt, CoPd, FePt, or FePd. In some embodiments, the magnetic material in the magnetic layer 715 has an atomic percentage greater than or equal to about 10% (e.g., about 10%, 20%, 30%, 40%, 50%, 60%, 70%, 80%, or 90%). In some embodiments, the magnetic material is evenly dispersed in the magnetic layer 715. That is, any position in the magnetic layer 715 substantially has the same atomic percentage of the magnetic material. In some embodiments, the magnetic material in an upper portion of the magnetic material has a greater atomic percentage than a lower portion of the magnetic layer 715. In some embodiments, an entirety of the magnetic layer 715 is made of the same magnetic material.

In some embodiments, the magnetic layer 715 may include a plurality of magnetic materials. By way of example but not limiting the present disclosure, the plurality of magnetic materials may include iron (Fe), cobalt (Co), nickel (Ni), proper alloys, or other suitable materials, such as CoFeTa, NiFe, CoFe, NiCo. By way of example but not limiting the present disclosure, the magnetic layer 715 may include nickel with an atomic percentage in a range from about 70% to about 90% and iron with an atomic percentage in a range from about 10% to about 30%. By way of example but not limiting the present disclosure, the magnetic layer

715 may include nickel with an atomic percentage in a range from about 30% to about 50%, zinc with an atomic percentage in a range from about 10% to about 30% and copper with an atomic percentage in a range from about 10% to about 30% plus ferric oxide (e.g., $Fe_2O_4$) with an atomic percentage in a range from about 0.5% to about 10%. By way of example but not limiting the present disclosure, the magnetic layer 715 may include yttrium with an atomic percentage in a range from about 70% to about 90% and bismuth with an atomic percentage in a range from about 10% to about 30% plus ferric oxide (e.g., $Fe_5O_{12}$) with an atomic percentage in a range from about 0.5% to about 10%. By way of example but not limiting the present disclosure, the magnetic layer 715 may include cobalt with an atomic percentage in a range from about 85% to about 95%, zirconium with an atomic percentage in a range from about 2.5% to about 7.5% and tantalum with an atomic percentage in a range from about 2.5% to about 7.5%.

In some embodiments, the magnetic layer 715 may be made of nitride or silicide of a magnetic material, such as nitride or silicide of iron (Fe), cobalt (Co), nickel (Ni), proper alloys thereof, suitable materials, or combinations thereof. In some embodiments, the magnetic layer 715 may be made of a ferromagnetic material. By way of example but not limiting the present disclosure, the magnetic layer 715 may include an alloy of a rare earth metal and a transition metal (RE-TM alloy), such as terbium iron cobalt (TbFeCo), terbium cobalt (TbCo), RE-cobalt palladium (RE-CoPd), RE-cobalt platinum (RE-CoPt), suitable materials, or combinations thereof. In some embodiments, the magnetic layer 715 may be made of a magnetic material with a dopant, such as boron (B), therein. By way of example but not limiting the present disclosure, the magnetic layer 715 may be made of CoFeB.

Figure 17:
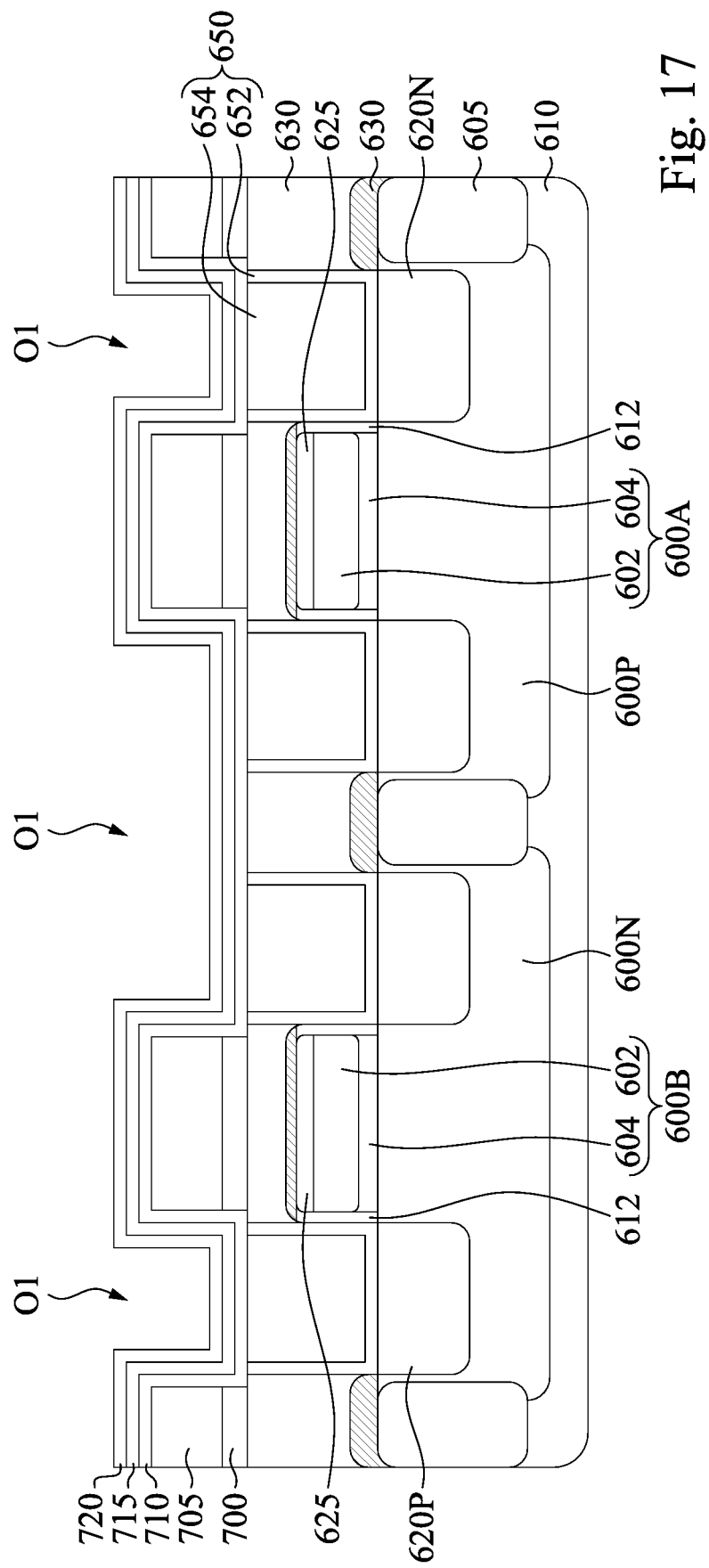

Reference is made to FIG. 17. A graphene layer 720 is deposited over the magnetic layer 715. In some embodiments, the graphene layer 720 can be formed by using the method and deposition systems described in FIGS. 1-10B, and thus relevant details will not be repeated hereinafter. For example, the magnetic layer 715 is similar to the magnetic layer ML1 of FIGS. 2-9, and the graphene layer 720 is similar to the graphene layer GL of FIGS. 2-9. In some embodiments, the thickness of the graphene layer 720 is in a range from about 1 nm to about 3 nm. With respect to the deposition process of FIG. 8, the deposition time of the graphene layer 720 may be in a range from about 3 seconds to about 15 seconds (e.g., about 3, 4, 5, 6, 7, 8, 9, 10, 11, 12, 13, 14, or 15 seconds). In some embodiments, the graphene layer 720 may have a smaller thickness than the magnetic layer 715.

Figure 18:
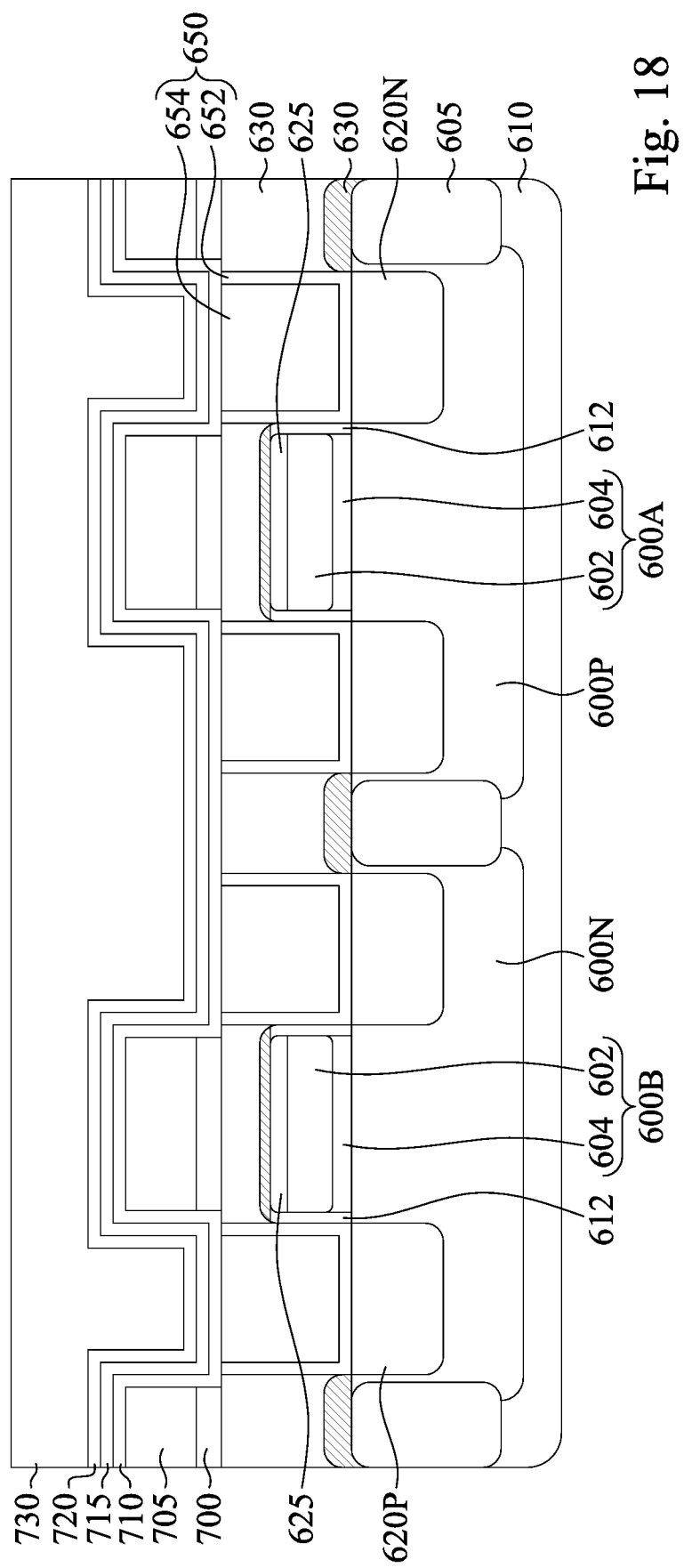

Reference is made to FIG. 18. A filling metal 730 is deposited over the graphene layer 720 and fills the openings O1. In some embodiments, the filling metal 730 is made of a highly conductive material. In some embodiments, the filling metal 730 may include metal, such as tungsten (W), ruthenium (Ru), aluminum (Al), copper (Cu), or other suitable conductive materials. In some embodiments, the conductive material 170 may be deposited by CVD, physical vapor deposition (PVD), sputter deposition, ALD, electroplating, or other techniques suitable for depositing conductive materials. In some embodiments, the magnetic layer 715 may be made of a higher permeability coefficient material than the filling metal 730. The magnetic layer 715 may be made of a higher hysteresis coefficient material than the filling metal 730. The magnetic layer 715 may be made of a lower conductivity material than the filling metal 730.

Figure 19:
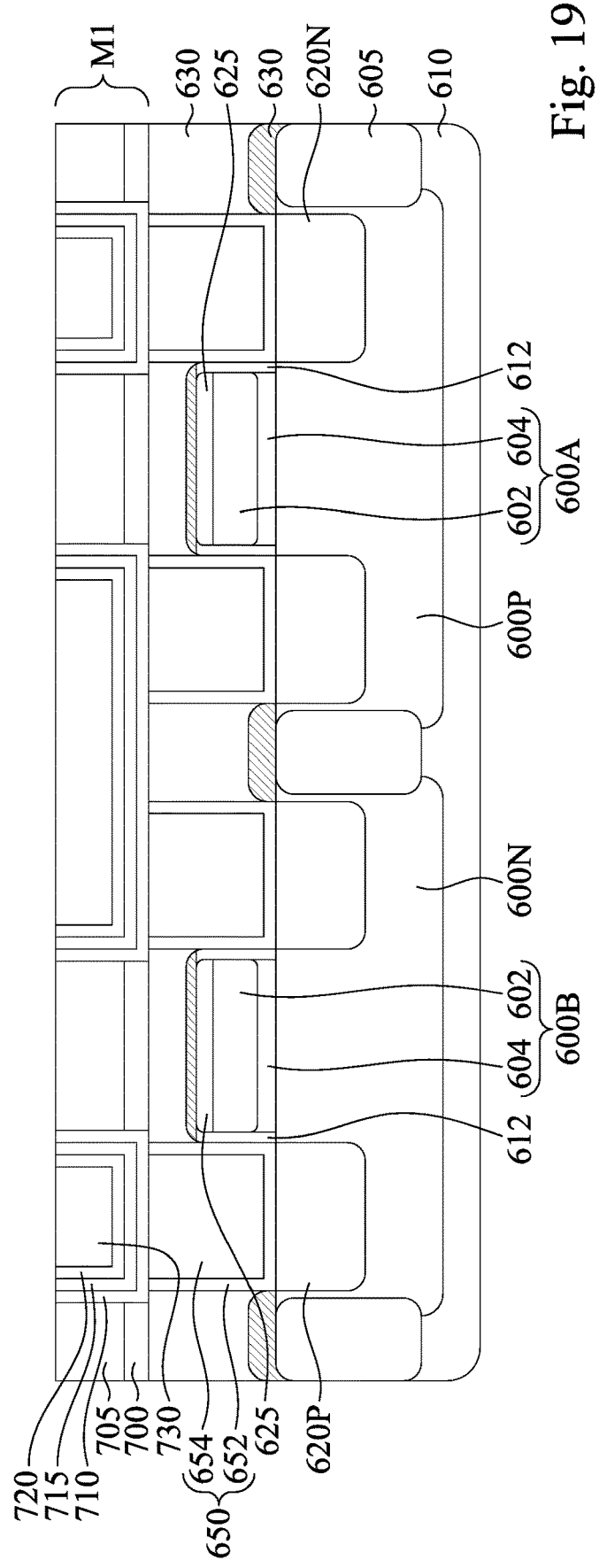

Reference is made to FIG. 19. A chemical mechanical polishing (CMP) process is performed to remove excessive materials of the filling metal 730, the graphene layer 720, the magnetic layer 715, and the liner 710 until the IMD layer 705 is exposed. In some embodiments, the remaining filling metal 730, the graphene layer 720, the magnetic layer 715, and the liner 710 can be referred to as a metal-1 (M1) layer in a back end of line (BEOL) process.

Figure 20:
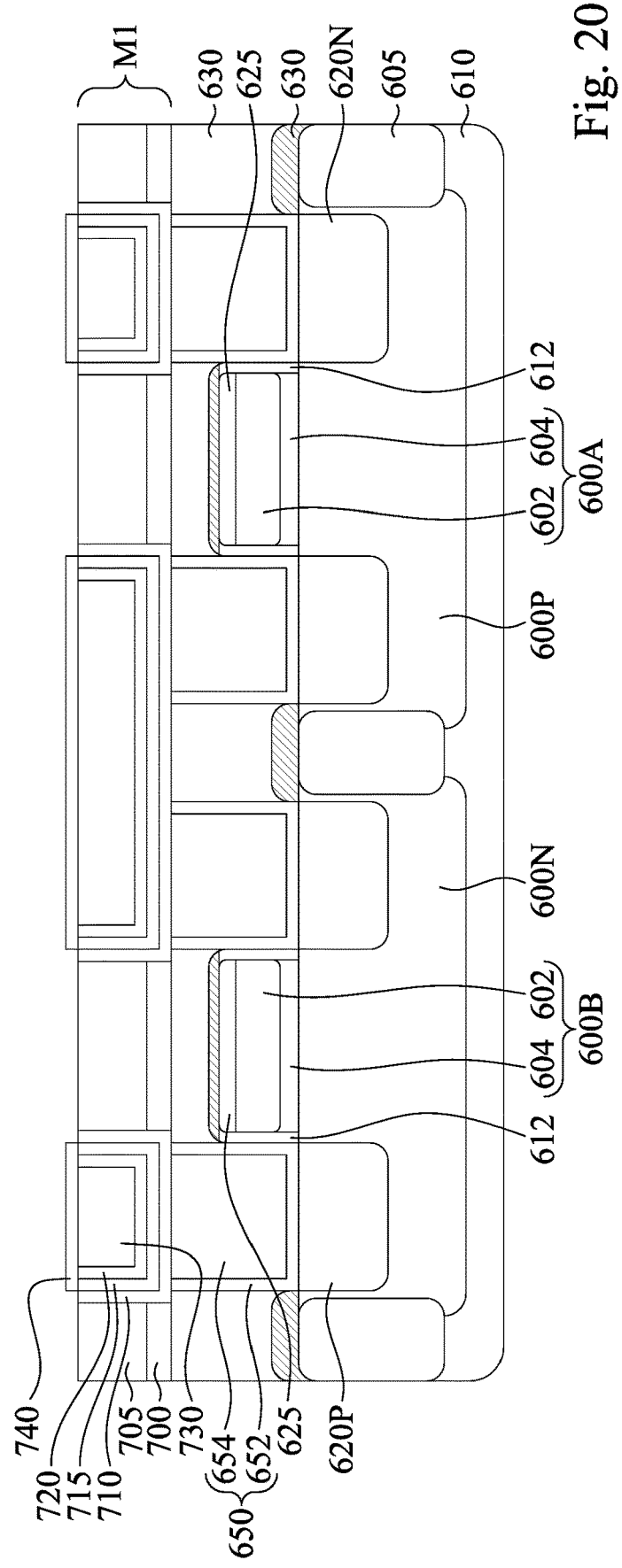

Reference is made to FIG. 20. A plurality of graphene layers 740 are deposited on the remaining filling metal 730, the graphene layer 720, the magnetic layer 715, and the liner 710. In greater detail, the graphene layer 720 grows on the filling metal 730 because the filling metal 730 is heated by the surrounding magnetic layer 715. The filling metal 730 may be heated to a predetermined temperature (e.g., greater than about 200° C. to about 400° C. in some embodiments) within a few seconds (e.g., about 3-30 seconds in some embodiments) through the surrounding magnetic layer 715 by the RF source of the deposition system of the present disclosure. Thus, heating the filling metal 730 through the surrounding magnetic layer 715 by using a high frequency induction heating process of the present disclosure may lower the duration of deposition time of the graphene layer, which in turn allows for improving the production efficiency, quality, and sheet resistance of the graphene layer. In some embodiments, the graphene layers 740 tend to grow on a graphene surface and/or a metal surface rather than on a dielectric surface. As an example in FIG. 20, the graphene layers 740 are selectively formed on the filling metal 730, the graphene layer 720, the magnetic layer 715, and the liner 710, while the graphene layers 740 are not formed on the IMD layer 705. In some embodiments, the graphene layers 740 can be formed by using the method and deposition systems described in FIGS. 1-10B, and thus relevant details will not be repeated hereinafter. For example, the graphene layers 740 are similar to the graphene layer GL of FIGS. 2-9. In some embodiments, the thickness of the graphene layers 740 is in a range from about 1 nm to about 3 nm. With respect to the deposition process of FIG. 8, the deposition time of the graphene layers 740 may be in a range from about 3 seconds to about 15 seconds (e.g., about 3, 4, 5, 6, 7, 8, 9, 10, 11, 12, 13, 14, or 15 seconds).

Figure 21:
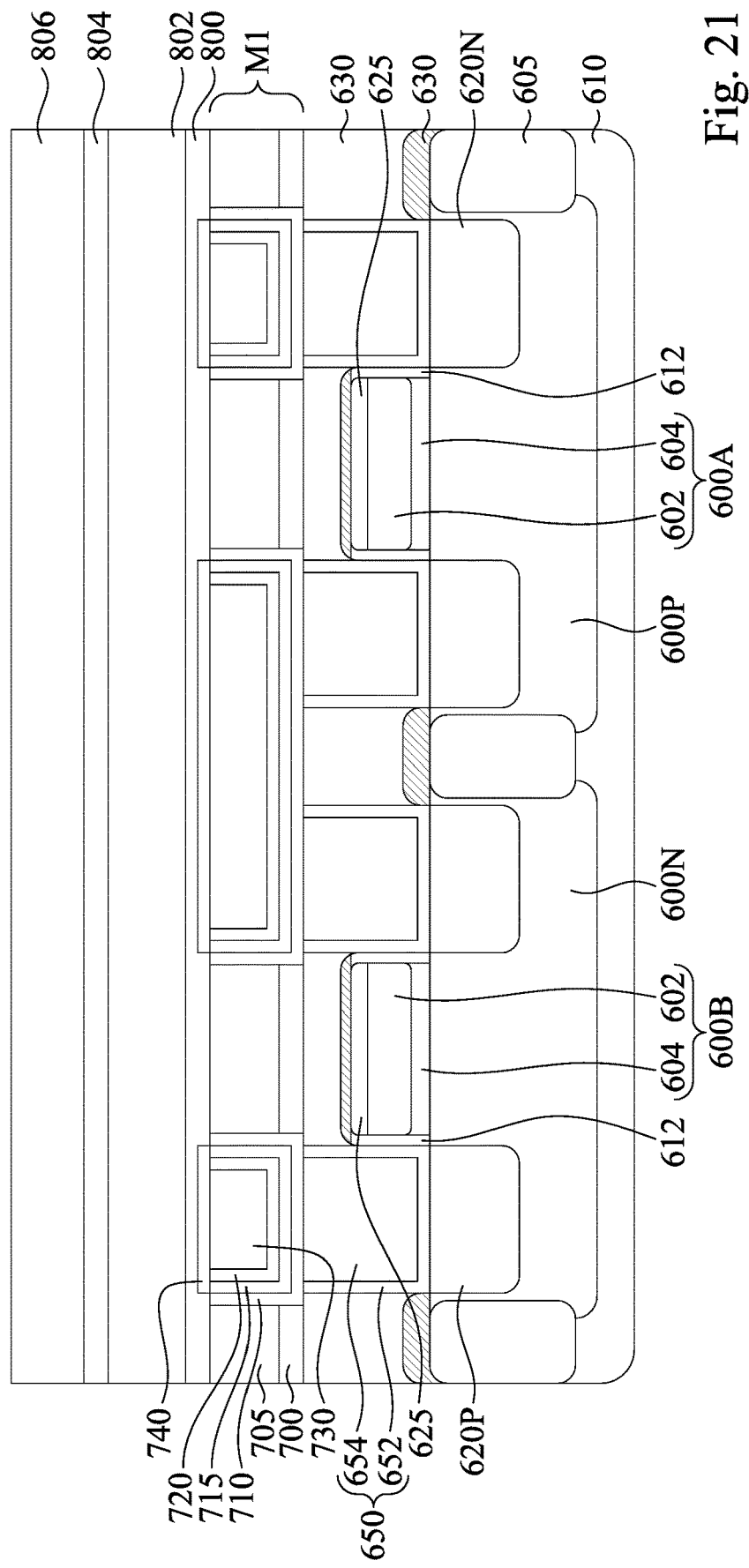

Reference is made to FIG. 21. An ESL 800, an IMD layer 802, an ESL 804, and an IMD layer 806 are formed sequentially over the IMD layer 705. The ESLs 800 and 804 are similar to the ESL 700, the IMD layers 802 and 806 are similar to the IMD layer 705, and thus relevant details will not be repeated for brevity. This is described in greater detail with reference to FIG. 21, the ESL 800 has non-uniform thickness due to the underlying graphene layers 740. That is, the ESL 800 on the graphene layers 740 may have a thinner thickness than that on the IMD layer 705. In some embodiments, the ESL 800 has uniform thickness, but the IMD layer 802 has non-uniform thickness due to the ESL 800 being conformal over the graphene layers 740.

Figure 22:
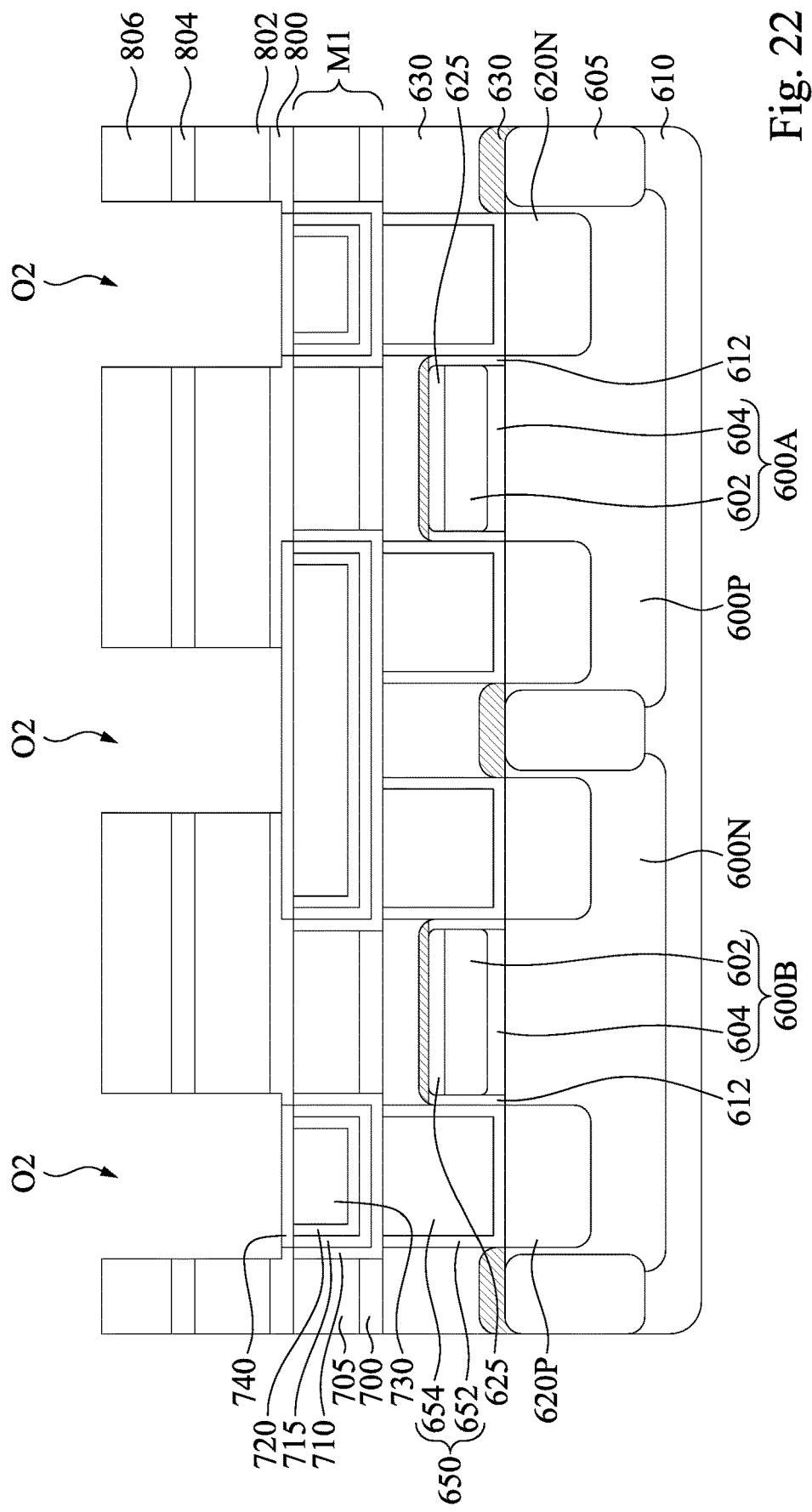

Reference is made to FIG. 22. The ESL 800, the IMD layer 802, the ESL 804, and the IMD layer 806 are patterned to form via openings O2. In some embodiments, the via openings O2 are aligned with and expose the graphene layers 740. In some embodiments, via openings O2 may be formed by, for example, forming a patterned photoresist layer over the IMD layer 806, followed by an etching process to remove portions of the ESL 800, the IMD layer 802, the ESL 804, and the IMD layer 806, and then removing the photoresist layer.

Figure 23:
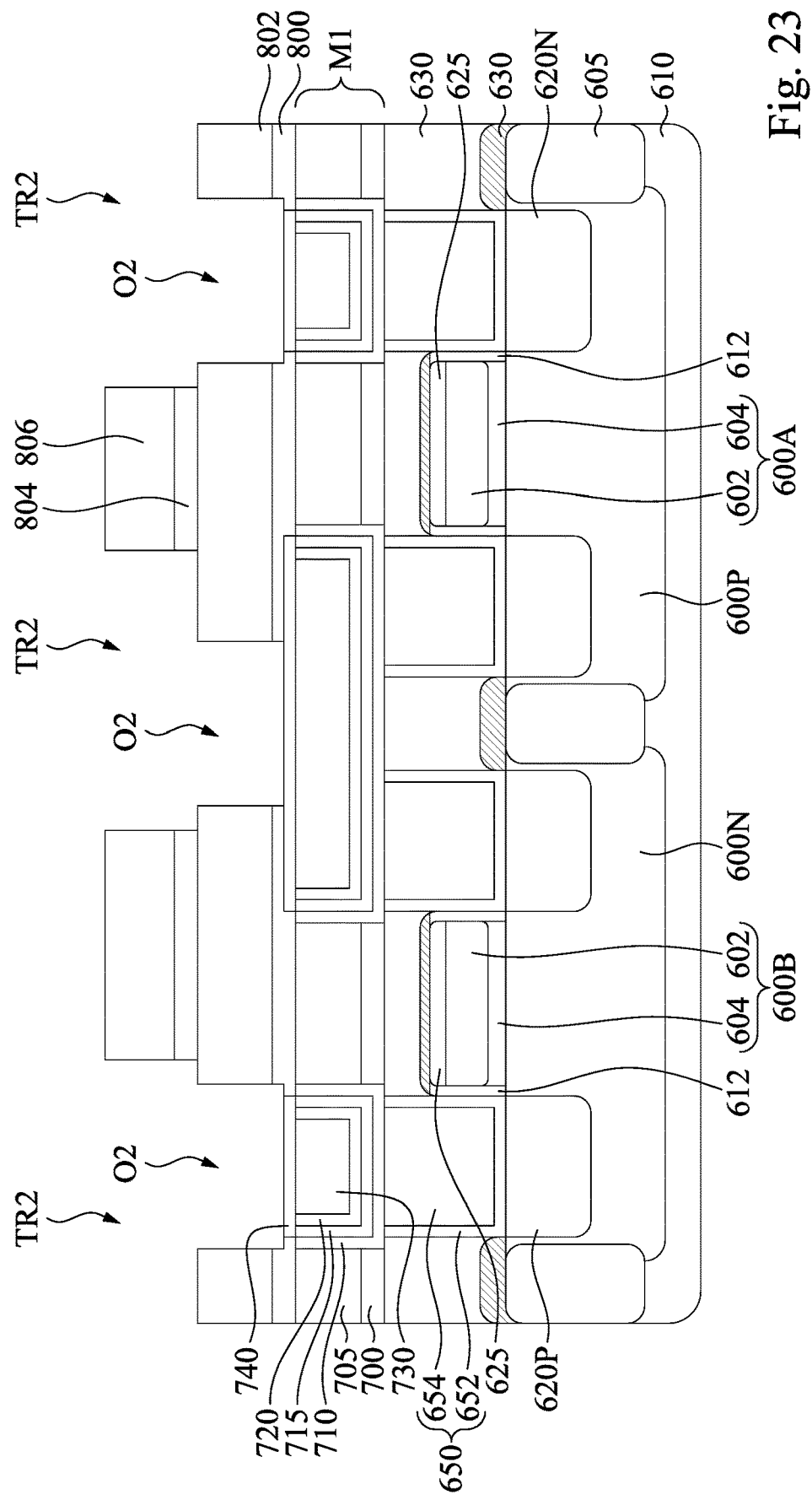

Reference is made to FIG. 23. The ESL 804 and the IMD layer 806 are patterned to form trenches TR2 that are aligned above the via openings O2. In some embodiments, the trenches TR2 may be formed by, for example, forming a patterned photoresist layer over the IMD layer 806, followed by an etching process to remove portions of the ESL 804, and the IMD layer 806, and then removing the photoresist layer.

Figure 24:
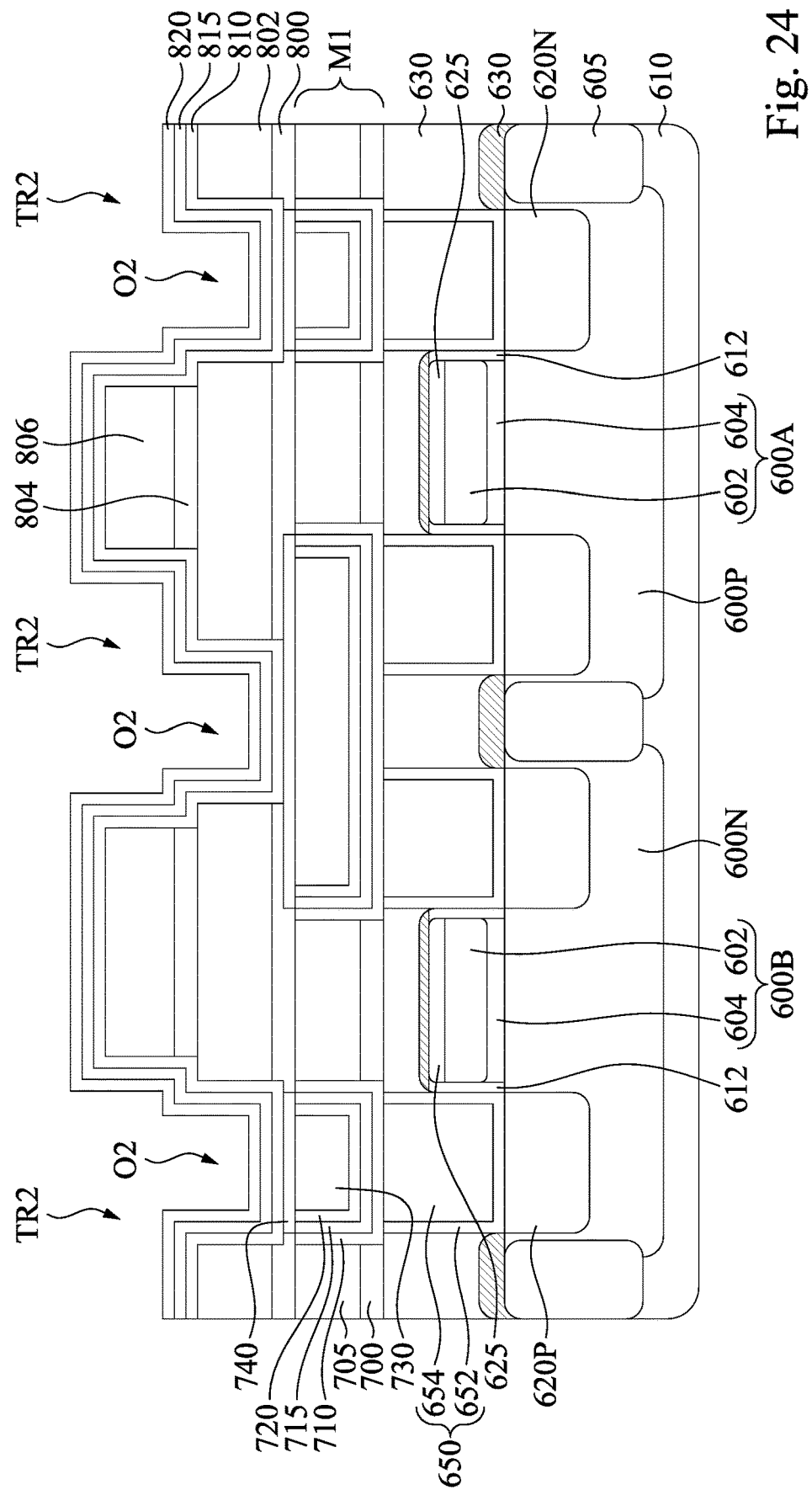

Reference is made to FIG. 24. A liner 810, a magnetic layer 815, and a graphene layer 820 are formed sequentially over the IMD layer 806 and in the via openings O2 and the trenches TR2. The liner 810 and the magnetic layer 815 are similar to the liner 710 and the magnetic layer 715, respectively, and thus relevant details will not be repeated for brevity. In some embodiments, the graphene layer 820 can be formed by using the method and deposition systems described in FIGS. 1-10B, and thus relevant details will not be repeated hereinafter. For example, the graphene layer 820 is similar to the graphene layer GL of FIGS. 2-9. In some embodiments, the thickness of the graphene layer 820 is in a range from about 3 nm to about 5 nm. With respect to the deposition process of FIG. 8, the deposition time of the graphene layer 820 may be in a range from about 3 seconds to about 15 seconds (e.g., about 3, 4, 5, 6, 7, 8, 9, 10, 11, 12, 13, 14, or 15 seconds). In some embodiments, the graphene layer 820 may have a smaller thickness than the magnetic layer 815. In some embodiments, the graphene layer 820 is thicker than the graphene layer 720, and the deposition time of the graphene layer 820 is longer than the deposition time of the graphene layer 720. In some embodiments, the magnetic layer 815 may be made of a higher permeability coefficient material than the liner 810. The magnetic layer 815 may be made of a higher hysteresis coefficient material than the liner 810. The magnetic layer 815 may be made of a lower conductivity material than the liner 810. In some embodiments, the magnetic layer 815 may have a greater thickness than the liner 810.

Figure 25:
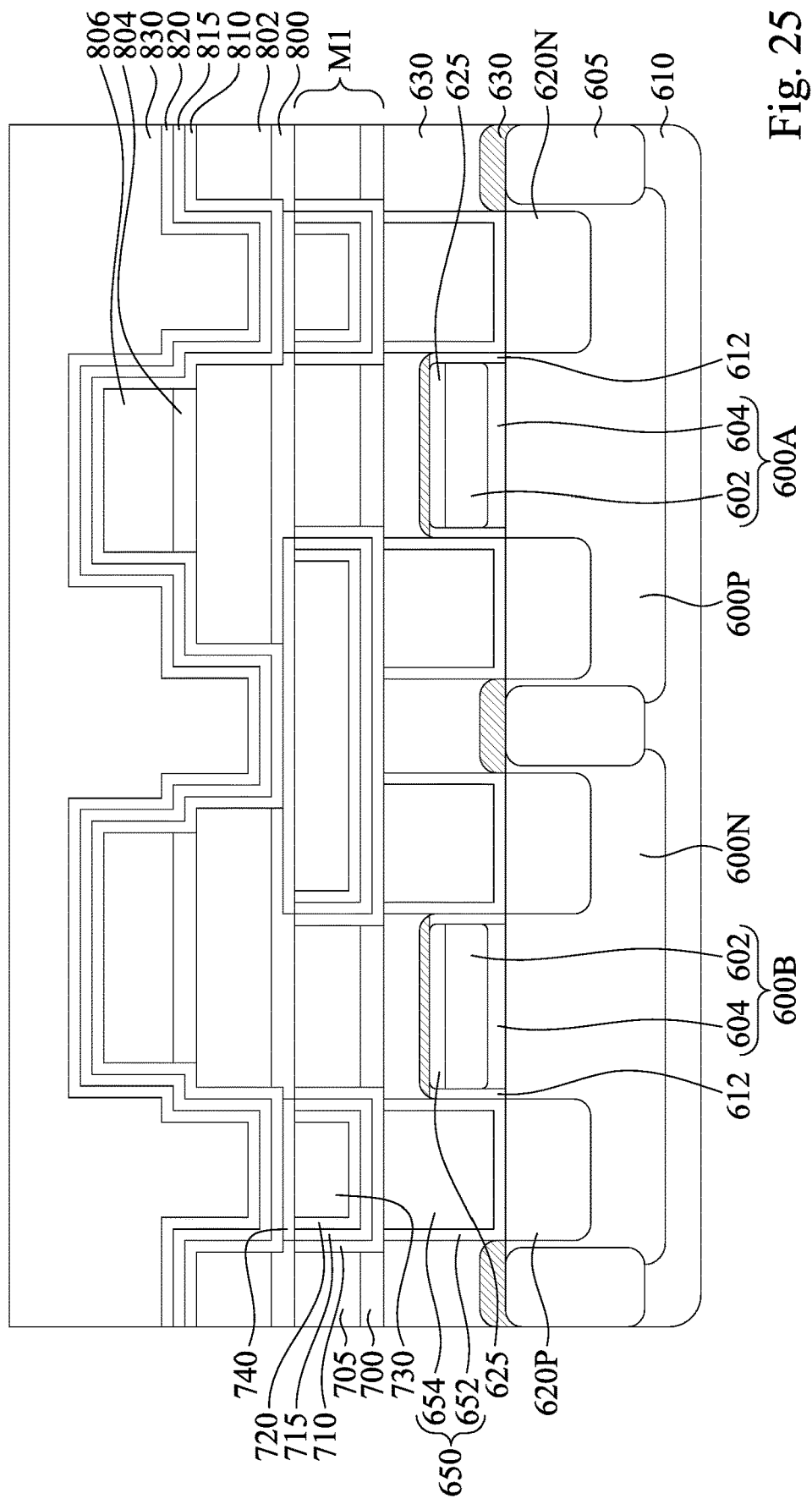

Reference is made to FIG. 25. A filling metal 830 is deposited over the graphene layer 820 and fills the via openings O2 and the trenches TR2. The filling metal 830 is similar to the filling metal 730, and thus relevant details will not be repeated hereinafter. In some embodiments, the magnetic layer 815 may be made of a higher permeability coefficient material than the filling metal 830. The magnetic layer 815 may be made of a higher hysteresis coefficient material than the filling metal 830. The magnetic layer 815 may be made of a lower conductivity material than the filling metal 830.

Figure 26:
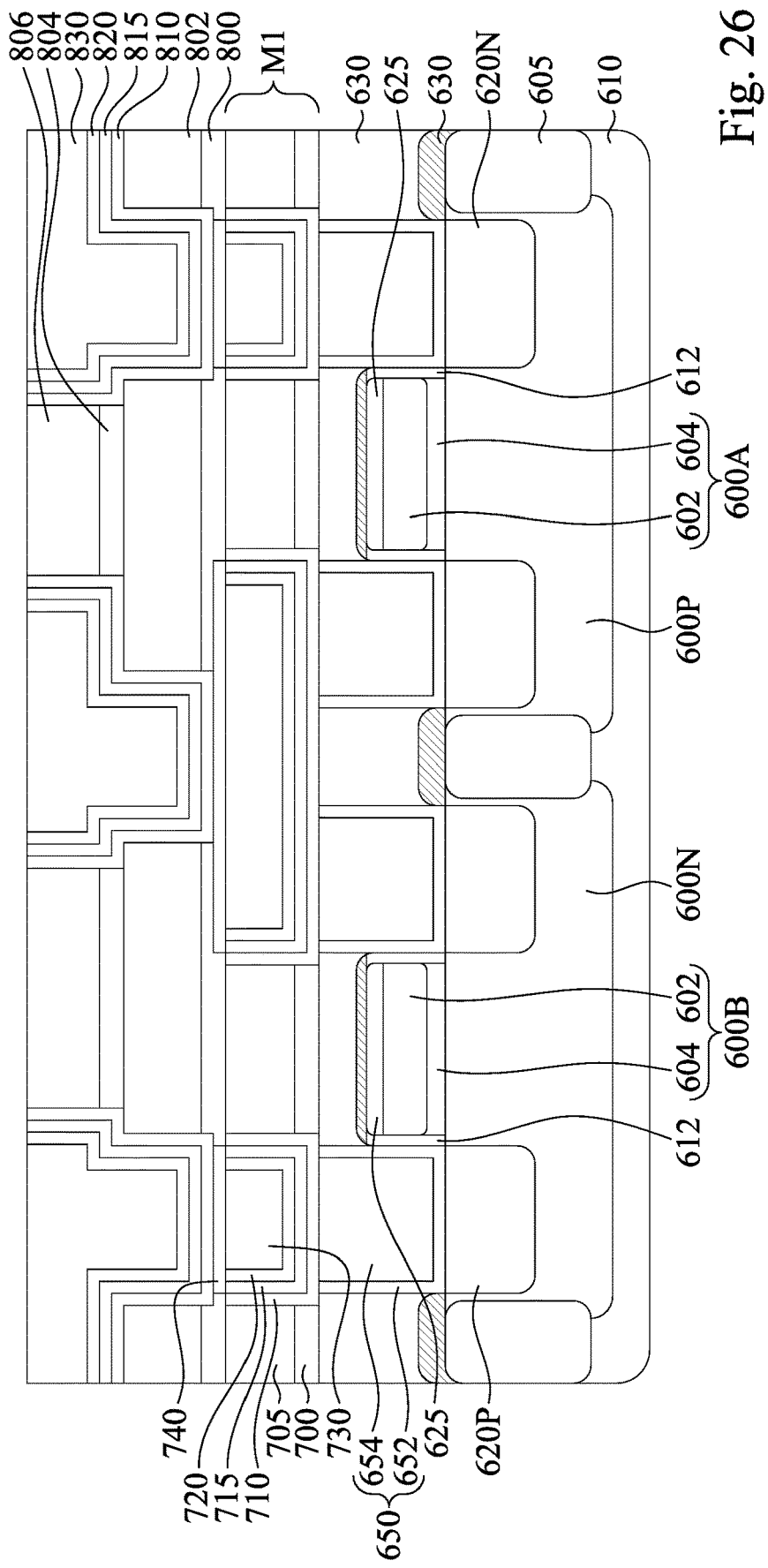

Reference is made to FIG. 26. A chemical mechanical polishing (CMP) process is performed to remove excessive materials of the filling metal 830, the graphene layer 820, the magnetic layer 815, and the liner 810 until the IMD layer 806 is exposed. In some embodiments, the remaining filling metal 830, the graphene layer 820, the magnetic layer 815, and the liner 810 can be referred to as a metal-2 (M2) layer in a back end of line (BEOL) process. In some embodiments, the line width of the metal-2 layer is greater than the line width of the metal-1 layer (see FIG. 19), and so the graphene layers 820 of the metal-2 layer can be formed thicker than the graphene layer 720 of the metal-1 layer.

Figure 27:
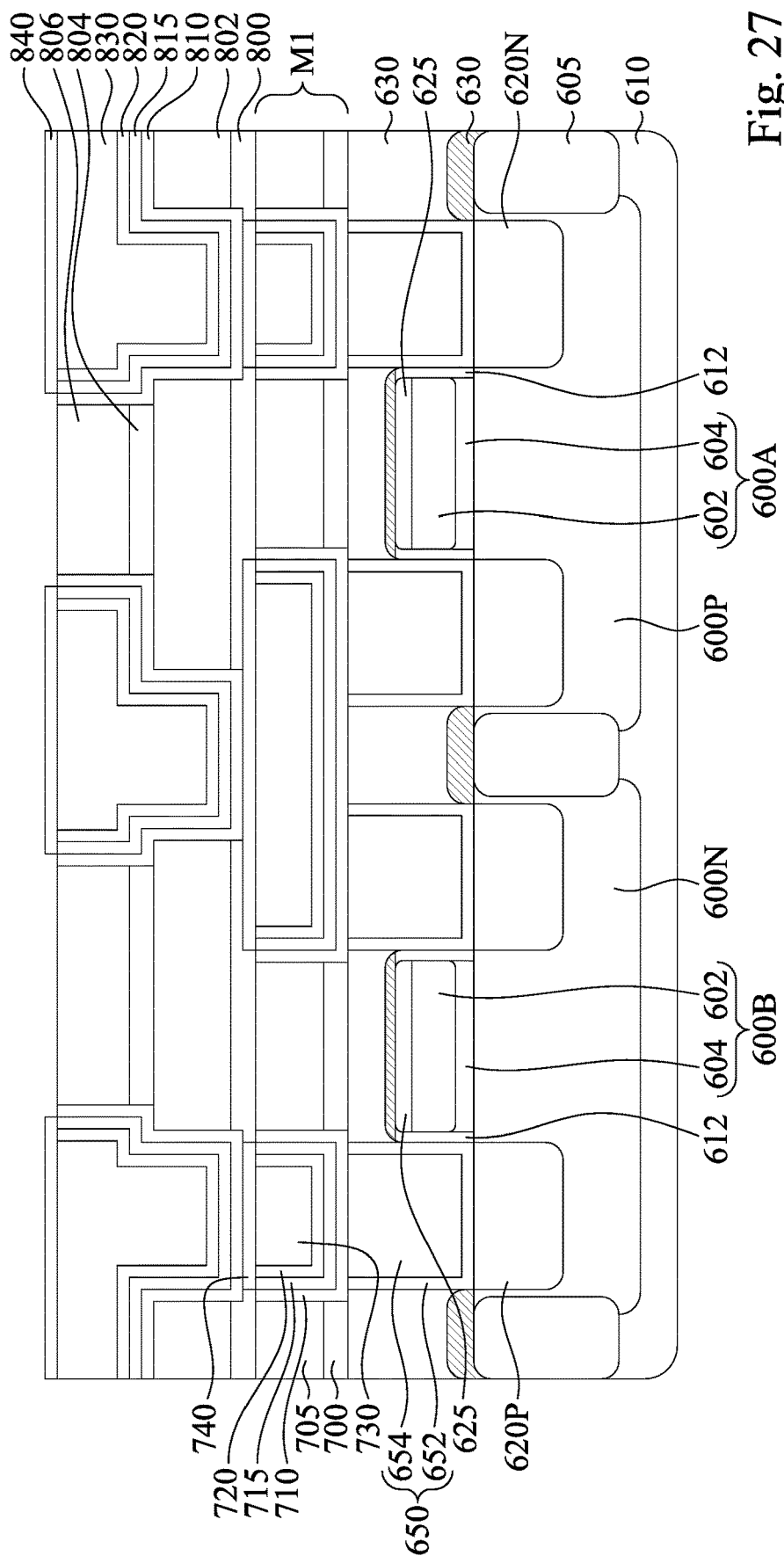

Reference is made to FIG. 27. A plurality of graphene layers 840 are deposited on the remaining filling metal 830, the graphene layer 820, the magnetic layer 815, and the liner 810. In some embodiments, the graphene layers 840 tend to grow on a graphene surface and/or a metal surface rather than on a dielectric surface. For example, the graphene layers 840 are selectively formed on the filling metal 830, the graphene layer 820, the magnetic layer 815, and the liner 810, while the graphene layers 840 are not formed on the IMD layer 806. In some embodiments, the graphene layers 840 can be formed by using the method and deposition systems described in FIGS. 1-10B, and thus relevant details will not be repeated hereinafter. For example, the graphene layers 840 are similar to the graphene layer GL of FIGS. 2-9. In some embodiments, the thickness of the graphene layer 840 is in a range from about 3 nm to about 5 nm. With respect to the deposition process of FIG. 8, the deposition time of the graphene layers 840 may be in a range from about 3 seconds to about 15 seconds (e.g., about 3, 4, 5, 6, 7, 8, 9, 10, 11, 12, 13, 14, or 15 seconds).

Figure 28:
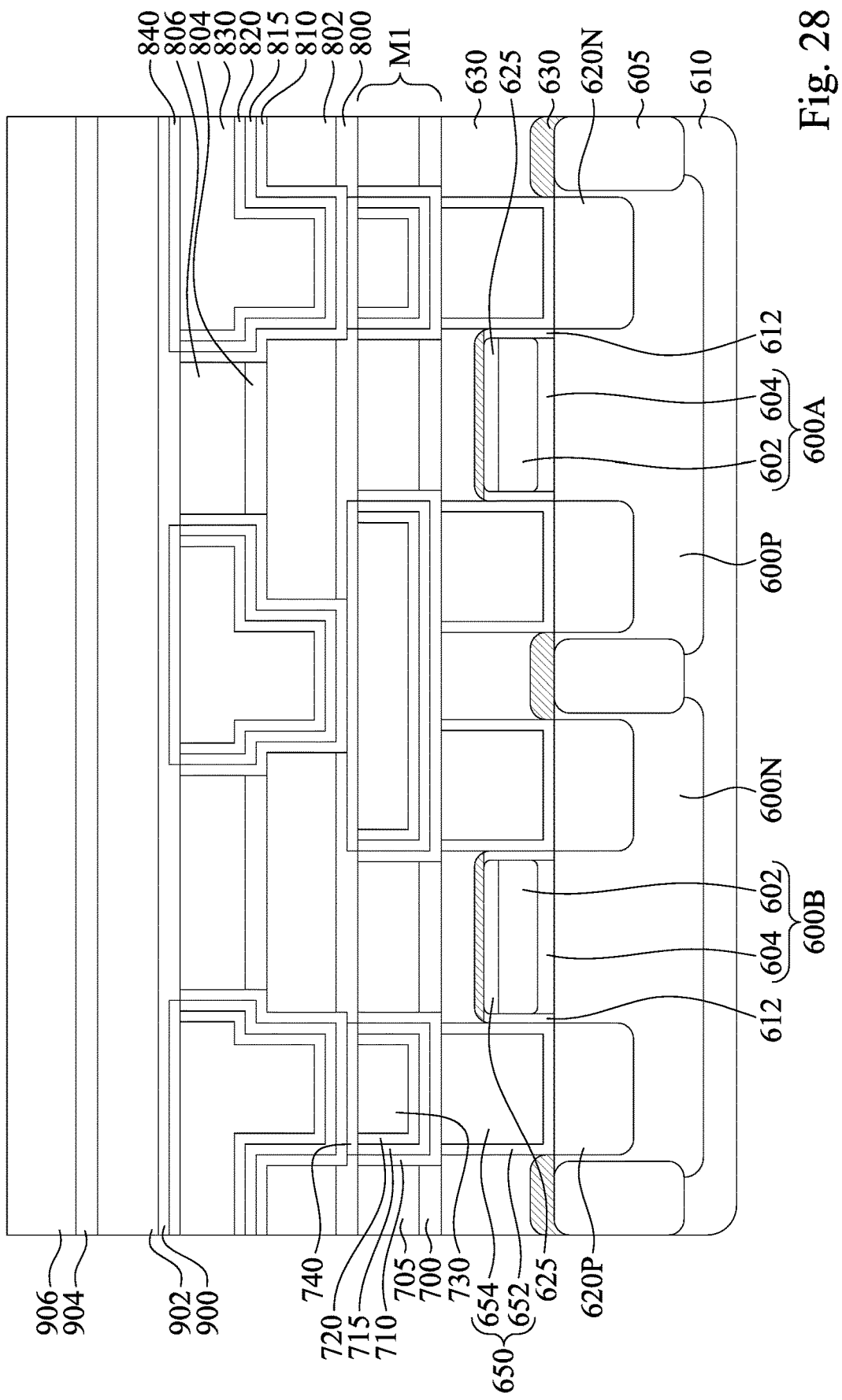

Reference is made to FIG. 28. An ESL 900, an IMD layer 902, an ESL 904, and an IMD layer 906 are formed sequentially over the IMD layer 806. The ESLs 900 and 904 are similar to the ESL 700, the IMD layers 902 and 906 are similar to the IMD layer 705, and thus relevant details will not be repeated for brevity.

Figure 29:
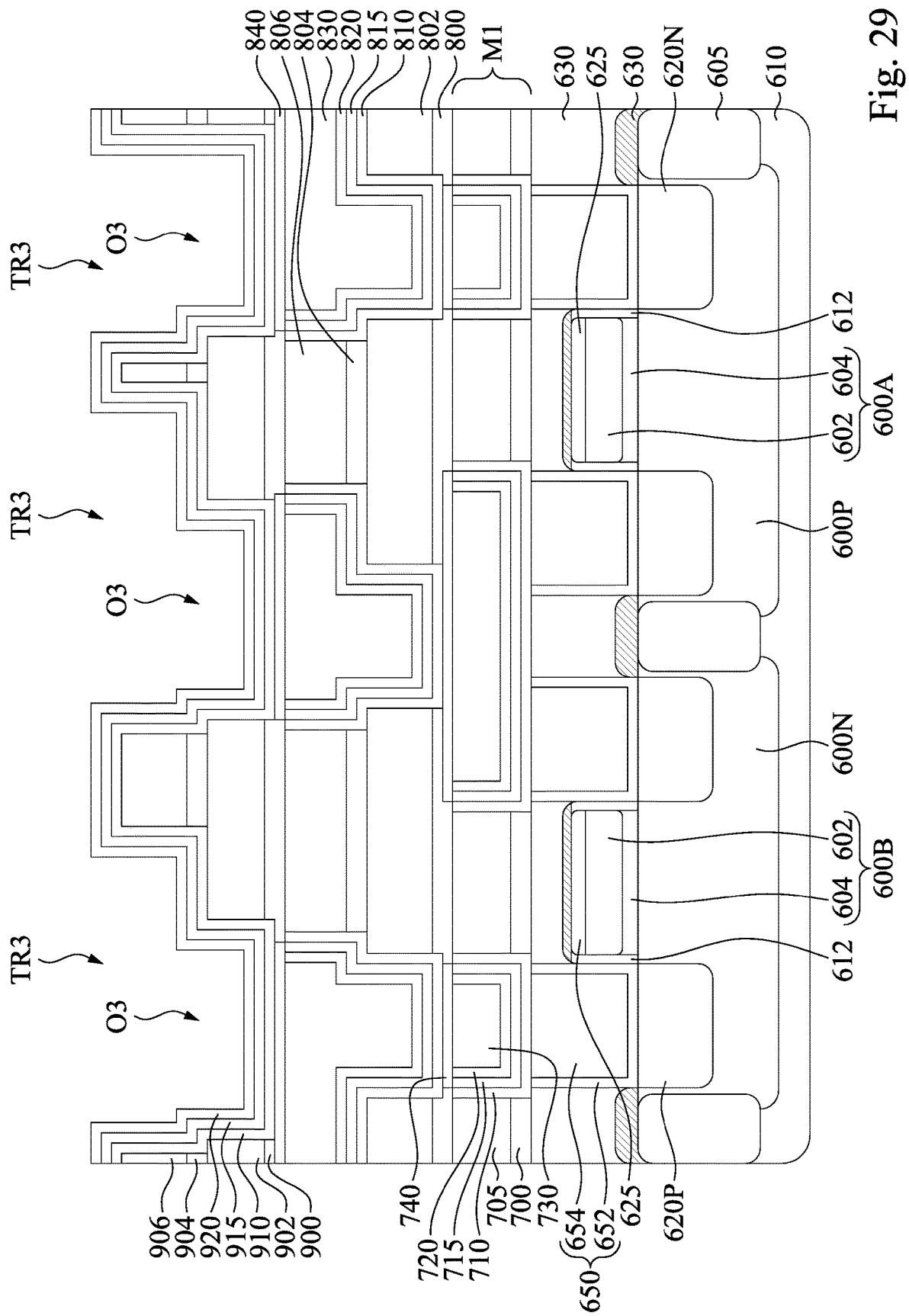

Reference is made to FIG. 29. The ESL 900, the IMD layer 902, the ESL 904, and the IMD layer 906 are patterned to form via openings O3 and trenches TR3 above the via openings O3. The formation of the via openings O3 and the trenches TR3 are similar respectively to the via openings O2 and the trenches TR2 described in FIGS. 23 and 24, and thus relevant details will not be repeated for brevity.

Next, a liner 910, a magnetic layer 915, and a graphene layer 920 are formed sequentially over the IMD layer 906 and in the via openings O3 and the trenches TR3. The liner 910 and the magnetic layer 915 are similar to the liner 710 and the magnetic layer 715, respectively, and thus relevant details will not be repeated for brevity. In some embodiments, the graphene layer 920 can be formed by using the method and deposition systems described in FIGS. 1-10B, and thus relevant details will not be repeated hereinafter. In some embodiments, the thickness of the graphene layer 920 is in a range from about 3 nm to about 10 nm. With respect to the deposition process of FIG. 8, the deposition time of the graphene layer 920 may be in a range from about 3 seconds to about 20 seconds (e.g., about 3, 4, 5, 6, 7, 8, 9, 10, 11, 12, 13, 14, 15, 16, 17, 18, 19, or 20 seconds). In some embodiments, the graphene layer 920 may have a smaller thickness than the magnetic layer 915. In some embodiments, the graphene layer 920 is thicker than the graphene layer 820, and the deposition time of the graphene layer 920 is longer than the deposition time of the graphene layer 820. In some embodiments, the magnetic layer 915 may be made of a higher permeability coefficient material than the liner 910. The magnetic layer 915 may be made of a higher hysteresis coefficient material than the liner 910. The magnetic layer 915 may be made of a lower conductivity material than the liner 910. In some embodiments, the magnetic layer 915 may have a greater thickness than the liner 910.

Figure 30:
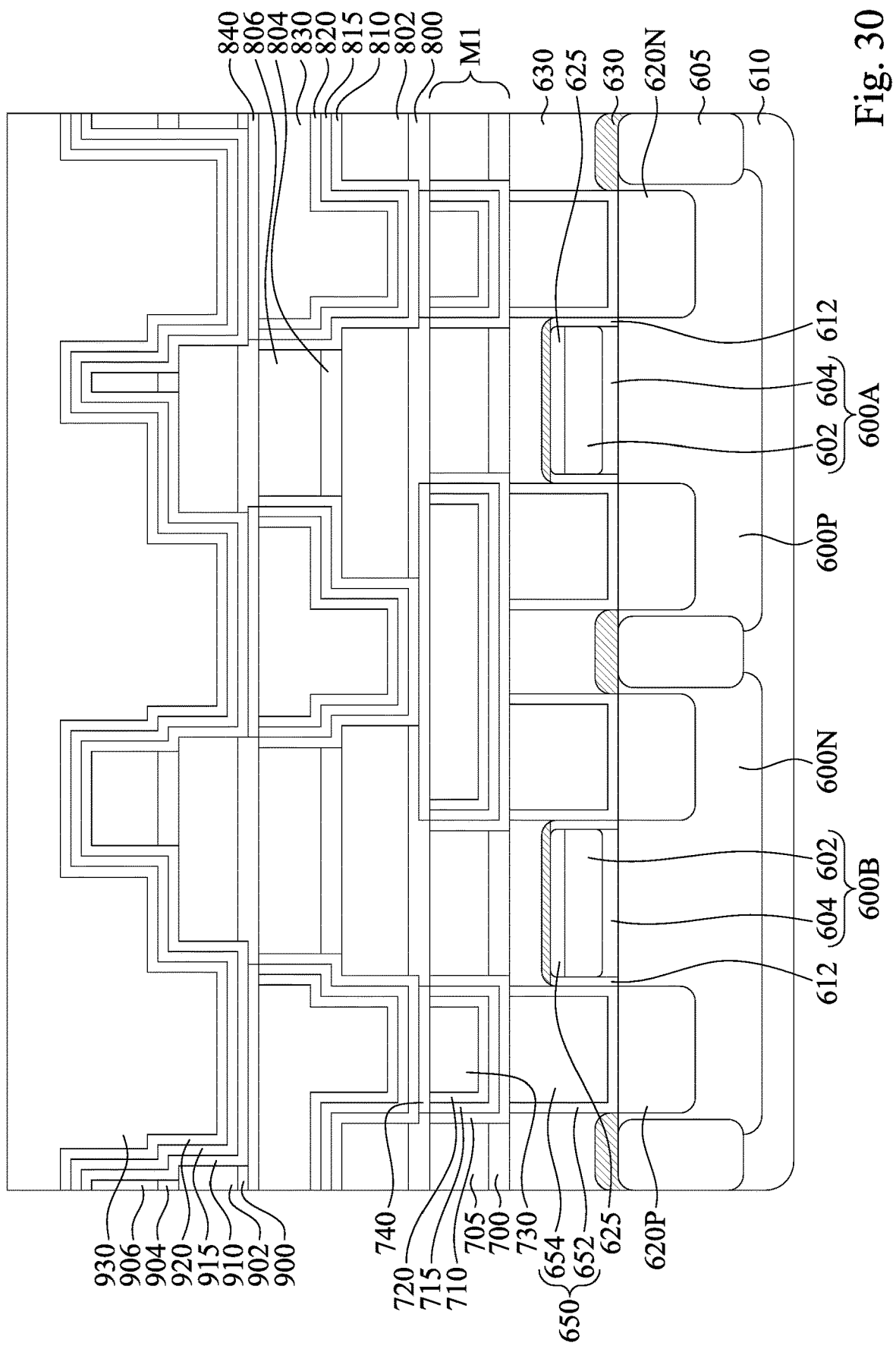

Reference is made to FIG. 30. A filling metal 930 is deposited over the graphene layer 920 and fills the via openings O3 and trenches TR3. The filling metal 930 is similar to the filling metal 730, and thus relevant details will not be repeated hereinafter. In some embodiments, the magnetic layer 915 may be made of a higher permeability coefficient material than the filling metal 930. The magnetic layer 915 may be made of a higher hysteresis coefficient material than the filling metal 930. The magnetic layer 915 may be made of a lower conductivity material than the filling metal 930.

Figure 31:
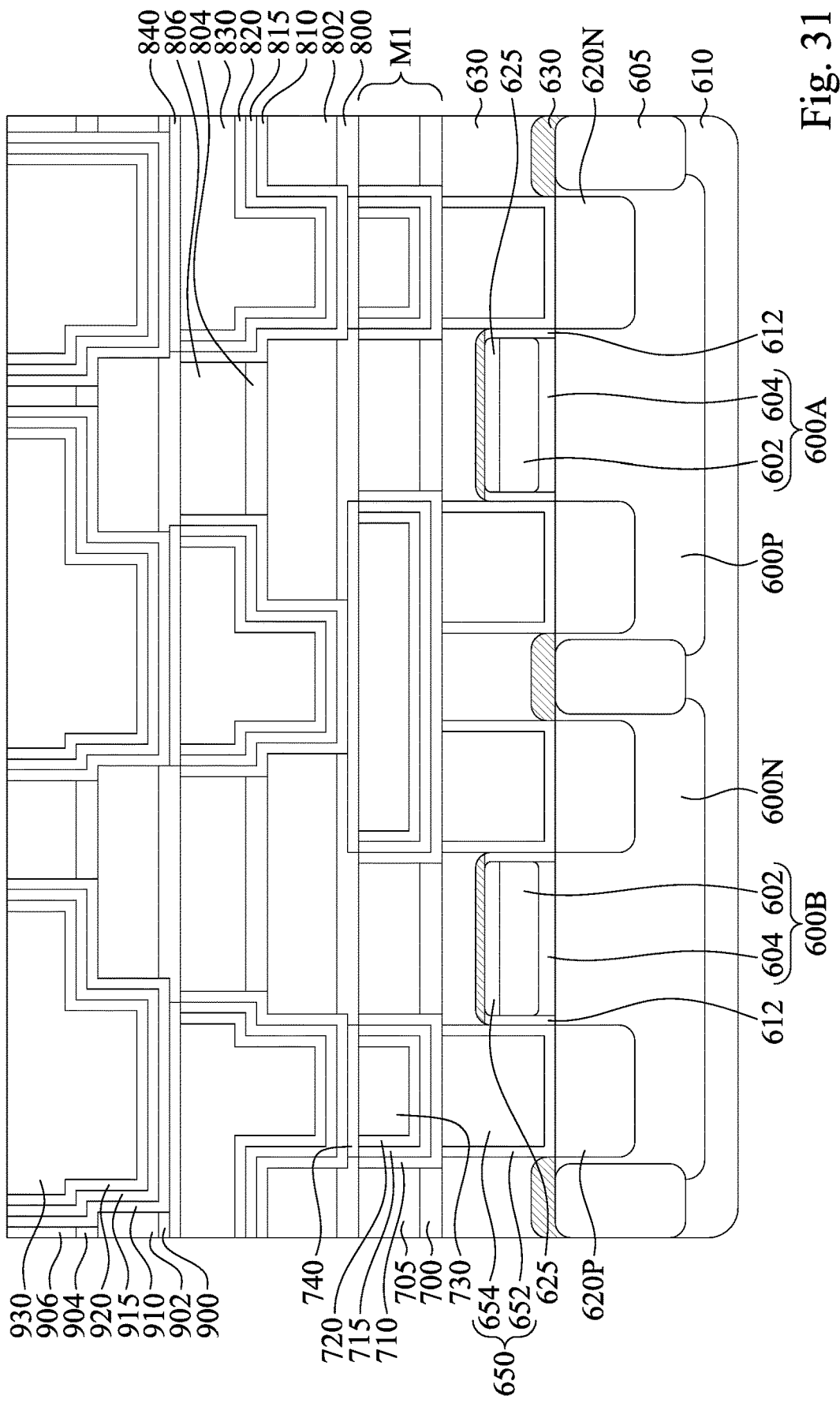

Reference is made to FIG. 31. A chemical mechanical polishing (CMP) process is performed to remove excessive materials of the filling metal 930, the graphene layer 920, the magnetic layer 915, and the liner 910 until the IMD layer 906 is exposed. In some embodiments, the remaining filling metal 930, the graphene layer 920, the magnetic layer 915, and the liner 910 can be referred to as a metal-3 (M3) layer in a back end of line (BEOL) process. In some embodiments, the line width of the metal-3 layer is greater than the line width of the metal-2 layer (see FIG. 26), and so the graphene layers 920 of the metal-3 layer can be formed thicker than the graphene layer 820 of the metal-2 layer.

Figure 32:
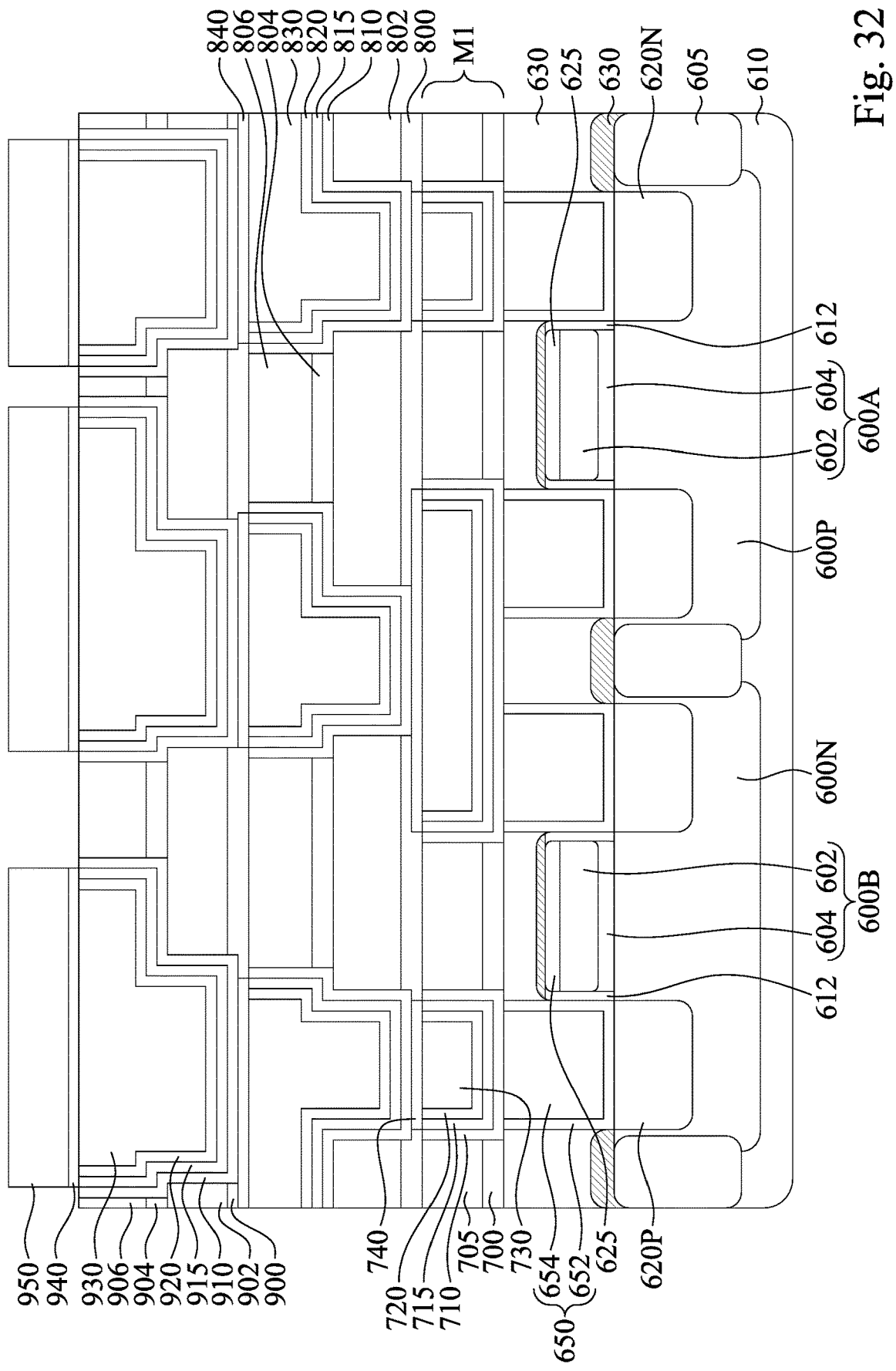

Reference is made to FIG. 32. A plurality of graphene layers 940 are deposited on the remaining filling metal 930, the graphene layer 920, the magnetic layer 915, and the liner 910. In some embodiments, the graphene layers 940 tend to grow on a graphene surface and/or a metal surface rather than on a dielectric surface. For example, the graphene layers 940 are selectively formed on the filling metal 930, the graphene layer 920, the magnetic layer 915, and the liner 910, while the graphene layers 940 are not formed on the IMD layer 906. In some embodiments, the graphene layers 940 can be formed by using the method and deposition systems described in FIGS. 1-10B, and thus relevant details will not be repeated hereinafter. In some embodiments, the thickness of the graphene layers 940 is in a range from about 3 nm to about 10 nm. With respect to the deposition process of FIG. 8, the deposition time of the graphene layers 940 may be in a range from about 3 seconds to about 20 seconds (e.g., about 3, 4, 5, 6, 7, 8, 9, 10, 11, 12, 13, 14, 15, 16, 17, 18, 19, or 20 seconds). In some embodiments, the graphene layers 940 are thicker than the graphene layers 840, and the deposition time of the graphene layers 940 is longer than the deposition time of the graphene layers 840.

Next, a plurality of conductive layers 950 are formed respectively over the graphene layers 940. In some embodiments, conductive layers 950 may be aluminum, or other suitable conductive materials. In some embodiments, the conductive layers 950 can be formed by PVD, CVD, ALD, or other suitable process. In some embodiments, the conductive layers 950 can be formed by, for example, depositing a conductive material over the substrate 610, followed by a photolithography process to pattern the conductive material to form the conductive layers 950.

Figure 33:
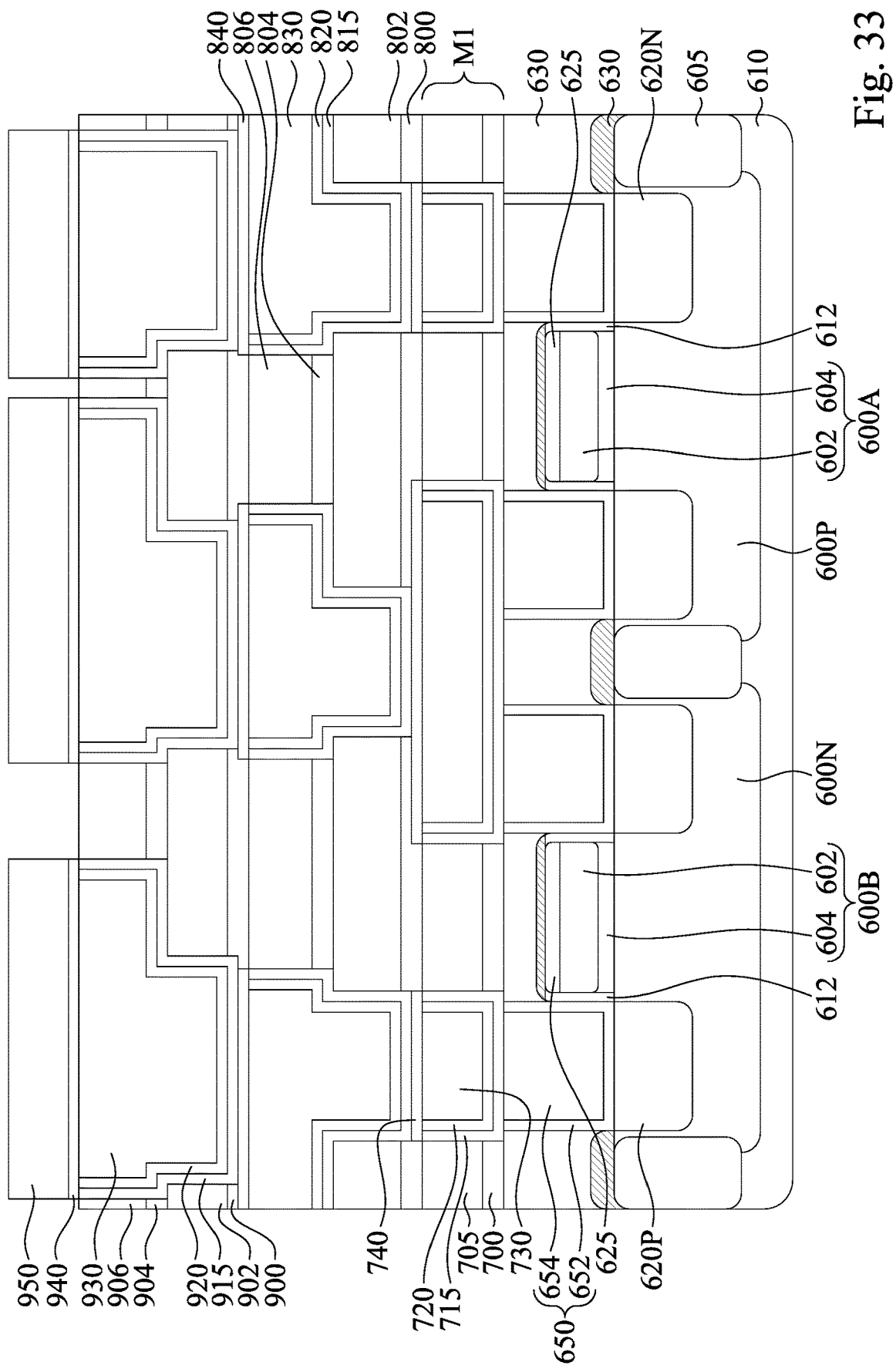
FIG. 33 illustrates a semiconductor device in accordance with some embodiments of the present disclosure.

FIG. 33 illustrates another semiconductor device at a stage corresponding to FIG. 28 according to some alternative embodiments of the present disclosure. A difference between FIGS. 32 and 33 is that the liner 710, the liner 810, and the liner 910 are omitted. Therefore, the magnetic layer 715 is formed to directly contact the IMD layer 705. The magnetic layer 815 is formed to directly contact the IMD layer 802, the ESL 804, and the IMD layer 806 and lands on the graphene layer 740. The magnetic layer 915 is formed to directly contact the IMD layer 902, the ESL 904, and the IMD layer 906 and lands on the graphene layer 840, such that the conductivity of interconnects of the semiconductor device may be improved. In some embodiments, the magnetic layer 715, 815, and/or 915 is configured to block diffusion of the material of the filling metal 730, 830, and/or 930 to the IMD layer 705, 802, 806, 902, and/or 906.

Based on the above discussion, it can be seen that the present disclosure offers advantages. It is understood, however, that other embodiments may offer additional advantages, and not all advantages are necessarily disclosed herein, and that no particular advantage is required for all embodiments. The graphene layer of the present disclosure is deposited on a magnetic layer by using a deposition system with an RF source. An advantage is that a short deposition time (e.g., about 3-30 seconds in some embodiments) of the graphene layer GL formed on the magnetic layer may be achieved to improve the production efficiency, quality, and sheet resistance of the graphene layer. In greater detail, the graphene layer may begin to be formed when the temperature is high enough (e.g., greater than about 200° C. to about 400° C. in some embodiments). The magnetic layer whereon the graphene layer will be formed may be heated to a predetermined temperature (e.g., greater than about 200° C. to about 400° C. in some embodiments) within a few seconds (e.g., about 3-30 seconds in some embodiments) by the RF source of the deposition system of the present disclosure. Thus, heating the magnetic layer by using a high frequency induction heating process of the present disclosure may lower the duration of deposition time of the graphene layer, which in turn allows for improving the production efficiency, quality, and sheet resistance of the graphene layer.

In some embodiments, a plasma enhanced chemical vapor deposition (PECVD) method includes loading a wafer having a magnetic layer thereon into a processing chamber equipped with a radio frequency (RF) system, introducing an aromatic hydrocarbon precursor into the processing chamber, and turning on an RF source of the RF system to decompose the aromatic hydrocarbon precursor into active radicals at a frequency greater than about 1000 Hz to form a graphene layer over the magnetic layer. In some embodiments, the frequency of the RF source is greater than about 300 kHz. In some embodiments, the magnetic layer is made of cobalt. In some embodiments, the magnetic layer is made of nickel. In some embodiments, the magnetic layer is made of iron. In some embodiments, the magnetic layer has a permeability coefficient greater than about $5 \times 10^{-5}$ (H/m). In some embodiments, the magnetic layer has a hysteresis coefficient greater than about 300 (A/m). In some embodiments, turning on the RF source of the RF system is performed at a time duration of less than about 60 seconds. In some embodiments, the method further includes performing an $H_2$ plasma treatment on the wafer to clean the magnetic layer after loading the wafer and prior to introducing the aromatic hydrocarbon precursor, wherein the turning on the RF source of the RF system is performed at a time duration shorter than a time duration of performing the $H_2$ plasma treatment. In some embodiments, turning on the RF source of the RF system is performed such that an ambient temperature inside the processing chamber is less than about 300° C. In some embodiments, turning on the RF source of the RF system is performed to heat the magnetic layer to a temperature greater than about 300° C. In some embodiments, turning on the RF source of the RF system is performed such that an ambient temperature inside the processing chamber is less than a temperature of the magnetic layer.

In some embodiments, a method includes forming a transistor on a substrate; forming a source/drain contact landing on a source/drain structure of the transistor; forming a dielectric layer over the source/drain contact; etching the dielectric layer to form an opening exposing the source/drain contact; depositing a magnetic layer in the opening of the dielectric layer; depositing a first graphene layer over the magnetic layer; depositing a filling metal to overfill a remainder of the opening of the dielectric layer, wherein the magnetic layer has a greater permeability coefficient than the filling metal; and performing a chemical mechanical polishing (CMP) process on the filling metal until the dielectric layer is exposed. In some embodiments, depositing the first graphene layer is performed by using an aromatic hydrocarbon precursor with a radio frequency (RF) power turned on. In some embodiments, depositing the first graphene layer is performed simultaneously with heating a temperature of the magnetic layer to greater than about 200° C. without using a heater. In some embodiments, the magnetic layer has a greater hysteresis coefficient than the filling metal. In some embodiments, the method further includes forming a liner in the opening of the dielectric layer prior to depositing the magnetic layer, wherein the magnetic layer has a greater permeability coefficient than the liner. In some embodiments, the method further includes forming a second graphene layer over the filling metal, the first graphene layer, and the magnetic layer, and not over the dielectric layer using an aromatic hydrocarbon precursor with an RF power turned on. In some embodiments, the magnetic layer has a permeability coefficient greater than about $5 \times 10^{-5}$ (H/m). In some embodiments, the magnetic layer has a hysteresis coefficient greater than about 300 (A/m).

In some embodiments, a structure includes a semiconductor substrate, a gate structure, a source/drain structure, a contact, a dielectric layer, and a metal line. The gate structure is on the semiconductor substrate. The source/drain structure is adjacent to the gate structure. The contact lands on the source/drain structure. The dielectric layer spans the contact and the gate structure. The metal line extends through the dielectric layer to the contact. The metal line comprises a liner over the contact, a magnetic layer over the liner, a graphene layer over the magnetic layer, and a filling metal over the graphene layer. The magnetic layer has a greater permeability coefficient than the filling metal. In some embodiments, the magnetic layer has a greater hysteresis coefficient than the filling metal. In some embodiments, the magnetic layer has a greater permeability coefficient than the liner. In some embodiments, the magnetic layer has a greater thickness than the graphene layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a substrate;
   a gate pattern over the substrate;
   epitaxial structures over the substrate and at opposite sides of the gate pattern;
   a contact over one of the epitaxial structures;
   a first conductive filling metal over the contact;
   a first graphene layer lining a sidewall of the first conductive filling metal; and
   a first magnetic layer over the first graphene layer.

2. The semiconductor structure of claim 1, wherein the first magnetic layer has a greater permeability coefficient than the first conductive filling metal.

3. The semiconductor structure of claim 1, wherein the first magnetic layer has a permeability coefficient greater than about $5 \times 10^{-5}$ H/m.

4. The semiconductor structure of claim 1, further comprising:
   a second graphene layer over a top surface of the first conductive filling metal.

5. The semiconductor structure of claim 4, further comprising:
   a second conductive filling metal over the first conductive filling metal; and
   a third graphene layer lining a sidewall and a bottom surface of the second conductive filling metal.

6. The semiconductor structure of claim 5, further comprising:
   a second magnetic layer formed on the third graphene layer, the second magnetic layer separating the third graphene layer from the second graphene layer.

7. A semiconductor structure, comprising:
   a substrate;
   a gate over the substrate;
   source/drain patterns over the substrate and at opposite sides of the gate;
   a source/drain contact over one of the source/drain patterns;
   a first conductive filling metal over the source/drain contact;
   a first graphene layer lining a sidewall and a bottom surface of the first conductive filling metal;
   a first magnetic layer wrapping around the first graphene layer; and
   a second graphene layer lining a top surface of the first conductive filling metal.

8. The semiconductor structure of claim 7, further comprising:
   a second conductive filling metal over the first conductive filling metal; and
   a third graphene layer lining a sidewall and a bottom surface of the second conductive filling metal.

9. The semiconductor structure of claim 8, further comprising:
   a second magnetic layer wrapping around the third graphene layer.

10. The semiconductor structure of claim 9, further comprising:
    a fourth graphene layer lining a top surface of the second conductive filling metal.

11. The semiconductor structure of claim 10, wherein the fourth graphene layer has a thicker thickness than the third graphene layer.

12. The semiconductor structure of claim 10, further comprising:
    an aluminum layer over the fourth graphene layer.

13. The semiconductor structure of claim 1, further comprising:
    a second graphene layer lining a bottom surface of the first conductive filling metal; and
    a second magnetic layer over the second graphene layer.

14. The semiconductor structure of claim 1, wherein the first graphene layer has a thinner thickness than the first magnetic layer.

15. A semiconductor structure, comprising:
    a substrate;
    a gate pattern over the substrate;
    epitaxial structures over the substrate and at opposite sides of the gate pattern;
    a contact over one of the epitaxial structures;
    a first conductive filling metal over the contact;
    a first graphene layer lining a bottom surface of the first conductive filling metal; and
    a first magnetic layer over the first graphene layer, the first magnetic layer separating the first graphene layer from the contact.

16. The semiconductor structure of claim 15, further comprising:
   a second graphene layer over a top surface of the first conductive filling metal.

17. The semiconductor structure of claim 15, wherein the first magnetic layer has a greater permeability coefficient than the first conductive filling metal.

18. The semiconductor structure of claim 15, wherein the first magnetic layer has a permeability coefficient greater than about $5\times10^{-5}$ H/m.

19. The semiconductor structure of claim 15, further comprising:
   a second conductive filling metal over the first conductive filling metal;
   a second graphene layer lining a sidewall of the second conductive filling metal; and
   a second magnetic layer formed on the second graphene layer.

20. The semiconductor structure of claim 15, further comprising:
   a second conductive filling metal over the first conductive filling metal;
   a second graphene layer lining a bottom of the second conductive filling metal; and
   a second magnetic layer formed on the second graphene layer, the second magnetic layer separating the second graphene layer from the first conductive filling metal.

* * * * *